(12) United States Patent  
Ogiwara

(10) Patent No.: US 7,053,431 B2  
(45) Date of Patent: May 30, 2006

(54) PHASE-CHANGE MEMORY DEVICE USING CHALCOGENIDE COMPOUND AS THE MATERIAL OF MEMORY CELLS

(75) Inventor: Ryu Ogiwara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/777,756

(22) Filed: Feb. 13, 2004

(65) Prior Publication Data

US 2005/0098811 A1 May 12, 2005

(30) Foreign Application Priority Data

Nov. 12, 2003 (JP) .............................. 2003-382823

(51) Int. Cl.  
*H01L 29/76* (2006.01)

(52) U.S. Cl. ...................................... 257/295; 257/296

(58) Field of Classification Search ................ 257/295, 257/296, 22, E31.029  
See application file for complete search history.

(56) References Cited

U.S. PATENT DOCUMENTS

| 5,296,716 | A  | * | 3/1994 | Ovshinsky et al. ............ 257/3 |
| 5,536,947 | A  | * | 7/1996 | Klersy et al. .................... 257/3 |
| 6,597,031 | B1 | * | 7/2003 | Kuge ........................... 257/295 |
| 6,731,528 | B1 | * | 5/2004 | Hush et al. .................. 365/100 |
| 2003/0001242 | A1 | | 1/2003 | Lowrey et al. |
| 2003/0185047 | A1 | | 10/2003 | Khouri et al. |

FOREIGN PATENT DOCUMENTS

JP 2003-229537 8/2003

OTHER PUBLICATIONS

Scott Tyson, et al., "Nonvolatile, High Density, High Performance Phase-Change Memory[1]", IEEE, 2000, pp. 385-390.

Manzur Gill, et al., "Ovonic Unified Memory—A High-Performance Nonvolatile Memory Technology for Stand-Alone Memory and Embedded Applications", ISSCC 2002, Session 12, TD: Digital Directions / 12.4, 7 pages.

Stefan Lai, et al., "OUM—A 180 nm Nonvolatile Memory Cell Element Technology for Stand Alone and Embedded Applications" IEEE, 2001, IEDM, pp. 803-806.

* cited by examiner

*Primary Examiner*—David Nelms  
*Assistant Examiner*—Thinh T Nguyen  
(74) *Attorney, Agent, or Firm*—Oblon, Spivak, McClelland, Maier & Neustadt, P.C.

(57) ABSTRACT

A phase-change memory device includes memory cells, a memory cell array, a first electrode layer, a word line, and a bit line. The memory cell includes a phase-change layer formed on a semiconductor substrate. The memory cell array has the memory cells arranged in a matrix. The phase change layer includes first regions which contact the semiconductor substrate in units of memory cells and a second region which connects the first regions arranged in a same column. The first electrode layer is formed on the second region. A contact area of each first region and the semiconductor substrate is smaller than a contact area of the second region and the first electrode layer. The bit line is electrically connected to the first electrode layer. The bit line is connects in common the phase-change layers of the memory cells arranged in the same column.

9 Claims, 35 Drawing Sheets

PHASE-CHANGE MEMORY DEVICE USING CHALCOGENIDE COMPOUND AS THE MATERIAL OF MEMORY CELLS

CROSS-REFERENCE TO RELATED APPLICATIONS

This application is based upon and claims the benefit of priority from the prior Japanese Patent Application No. 2003-382823, filed Nov. 12, 2003, the entire contents of which are incorporated herein by reference.

BACKGROUND OF THE INVENTION

1. Field of the Invention

The present invention relates to a phase-change memory device, and more particularly, to the memory cell structure of the phase-change memory device.

2. Description of the Related Art

Phase-change memory devices have recently been developed as new-type nonvolatile memories.

Phase-change memory devices employ, in memory elements, a phase-change film formed of a chalcogenide compound, as used in, for example, CD-RWs and DVD-RAMs. Depending upon whether the phase-change film is in the amorphous or crystalline state, "0" or "1" is stored. Phase-change memory devices are characterized not only in that they are nonvolatile, but also in that they allow data to be written more quickly and to be rewritten a much larger number of times than do existing flash memories.

For example, "Non-Volatile High-Density, High-Performance Phase-Change Memory" by Scott Tyson et al. in IEEE Aerospace Conference 2000 describes the memory structure of a conventional phase-change memory device (see, for example, pages 385 to 390). In the disclosed structure, since a phase change occurs only in part of a chalcogenide compound, the voltage applied to the compound can be reduced, thereby reducing the power consumption of the phase-change memory device. However, this device requires a large memory cell array area. Further, if one end of each of the memory cells formed of the chalcogenide compound is connected to one end of any other memory cell by, for example, a metal wire, the power consumption of the phase-change memory device is increased.

BRIEF SUMMARY OF THE INVENTION

A phase-change memory device according to an aspect of the present invention including:

memory cells including phase-change layers formed on a semiconductor substrate, the phase-change layer showing an amorphous-crystalline phase change;

a memory cell array which has the memory cells arranged in a matrix, the phase change layer including first regions which contact the semiconductor substrate in units of memory cells and a second region which connects the first regions arranged in a same column;

a first electrode layer formed on the second region of each phase-change layer, a contact area of each first region and the semiconductor substrate being smaller than a contact area of the second region and the first electrode layer, the first regions and the second region being formed of a material which shows a phase change between an amorphous phase and a crystalline phase;

a word line which connects the memory cells arranged in a same row; and a bit line electrically connected to the first electrode layer, the bit line connecting in common the phase-change layers of the memory cells arranged in the same column.

A phase-change memory device according to another aspect of the present invention comprises:

memory cells including a phase-change layer formed on a semiconductor substrate, the phase-change layer showing an amorphous-crystalline phase change;

a memory cell array which has the memory cells arranged in a matrix;

a word line which connects the memory cells arranged in a same row; and a bit line which connects the phase-change layers of the memory cells arranged in a same column, each of the phase-change layers including first regions which contact the semiconductor substrate in units of memory cells and a second region which connects the first regions arranged in the same column and which contacts the bit line, a contact area of each first region and the semiconductor substrate being smaller than a contact area of the second region and the bit line.

DETAILED DESCRIPTION OF THE INVENTION

Figure 1:
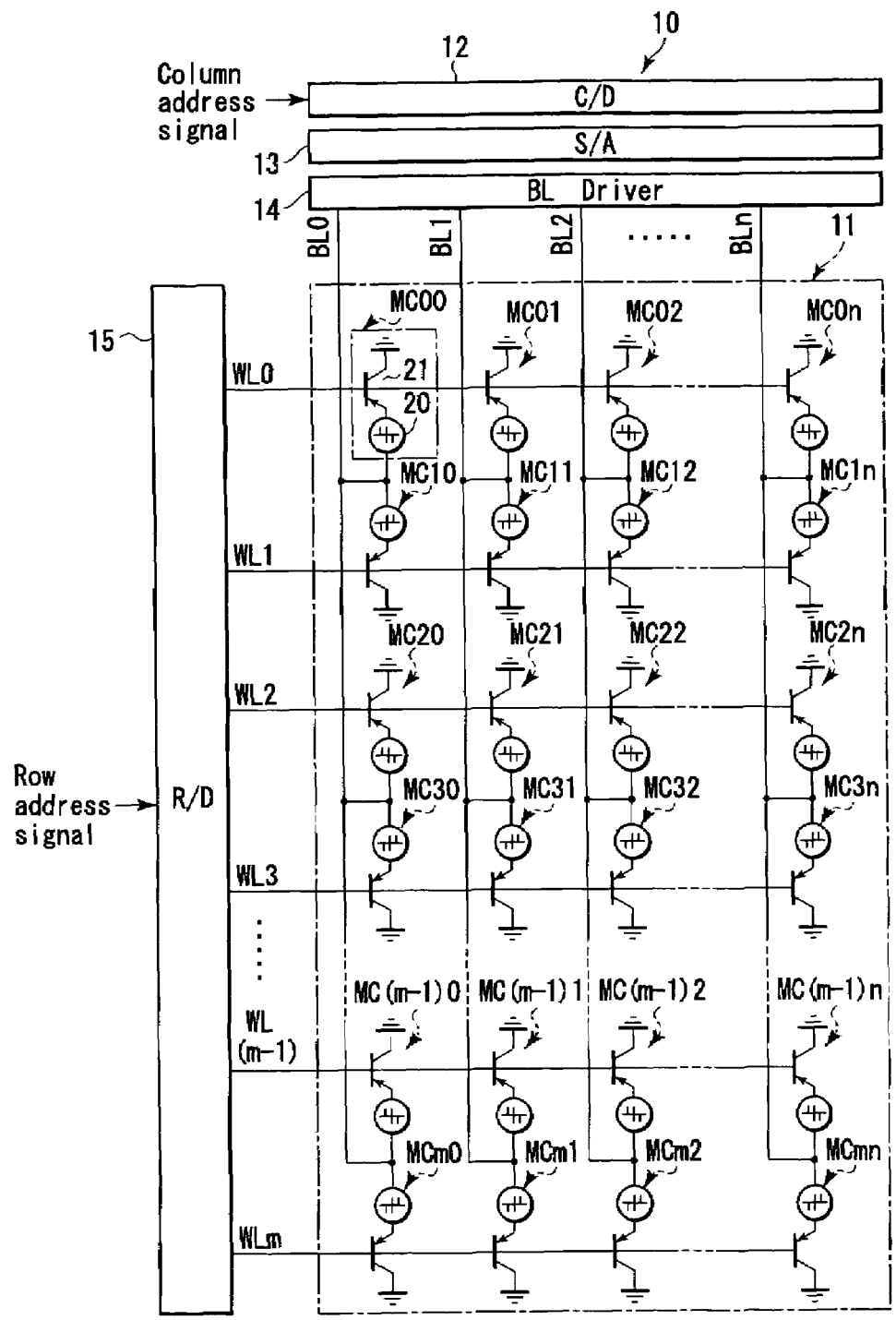
FIG. 1 is a block diagram illustrating a phase-change memory device according to a first embodiment of the invention.

Referring first to FIG. 1, a phase-change memory according to a first embodiment of the invention will be described. FIG. 1 is a block diagram illustrating the phase-change memory device of the first embodiment.

As seen from FIG. 1, a phase-change memory device 10 comprises a memory cell array 11, column decoder 12, sense amplifier 13, bit-line driver 14 and row decoder 15.

The memory cell array 11 has a number (m+1)×(n+1) of memory cells MC00 to MCmn arranged in a matrix (m, n: natural number; FIG. 1 shows only 6×4 cells). Each memory cell MC includes a phase-change element 20 and switching transistor (pnp bipolar transistor) 21. The phase-change element 20 is formed of, for example, a chalcogenide compound. One end of the phase-change element 20 is connected to one of bit lines BL0 to BLn, and the other end of the element 20 is connected to one end (emitter) of the current path of the switching transistor 21. The base of the switching transistor 21 is connected to one of word lines WL0 to WLm, and the other end (collector) of the current path is connected to ground.

The bases of the switching transistors 21 of the memory cells arranged in the same row are commonly connected to one of the word lines WL0 to WLm. Further, one end of each of the phase-change elements 20 of the memory cells, arranged in the same column, is commonly connected to one of the bit lines BL0 to BLn.

The column decoder 12 decodes a column address signal to obtain a column address decode signal.

During data writing and reading, the bit-line driver 14 selects one of the bit lines BL0 to BLn based on the column address decode signal, and applies a voltage pulse to the selected bit line.

The row decoder 15 decodes a row address signal to obtain a row address decode signal. During data writing and reading, the row decoder 15 selects one of the word lines WL0 to WLm based on the row address decode signal, and applies 0 V to the selected word line.

The sense amplifier 13 amplifies the data read from the memory cells selected by the row decoder 15 and column decoder 12.

Figure 2:
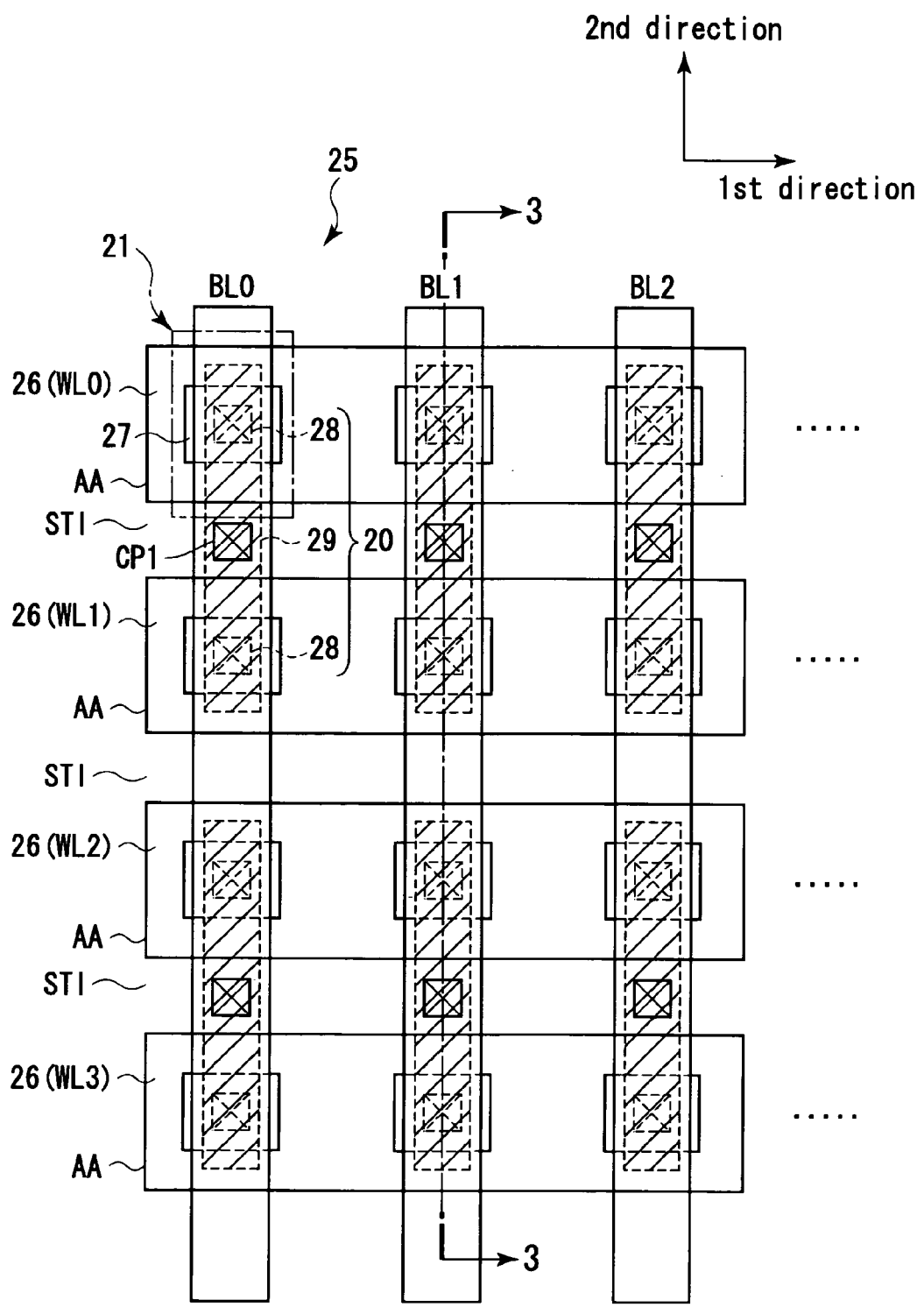
FIG. 2 is a plan view illustrating the phase-change memory device of the first embodiment.

Referring to FIG. 2, the plane pattern of the memory cell array 11 will be described. FIG. 2 is a plan view of the memory cell array 11.

As shown, a p-type semiconductor substrate 25 has element regions AA extending in a first direction and arranged in a stripe pattern. The p-type semiconductor substrate 25 serves as the common collector of the switching transistors 21. An n-type impurity diffusion layer 26 is formed in the surface of each element region AA. The n-type impurity diffusion layers 26 serve as the bases of the switching transistors 21, i.e., the word lines WL0 to WLm. An element isolation region STI is provided in the region other than the element regions AA. P-type impurity diffusion layers 27 separate from each other are provided in each element region AA. The p-type impurity diffusion layers 27 serve as the emitters of the switching transistors 21.

Each phase-change element 20 is provided on the corresponding switching transistor 21. Each phase-change element 20 includes first and second regions 28 and 29. The first region 28 is provided on the emitter 27 of each switching transistor 21 and is column-shaped. The second region 29 is in the shape of a stripe extending in a second direction perpendicular to the first direction, and bridges a pair of switching transistors 21 adjacent in the second direction. The second region 29 is connected to the first regions 28 connected to the pair of switching transistors 21.

The bit lines BL0 to BLn extending in the second direction and arranged in a stripe pattern are provided on the phase-change elements 20. Each of the bit lines BL0 to BLn is connected, by contact plugs CP1, to the second regions 29 of the phase-change elements 20 arranged in the same column.

Figure 3:
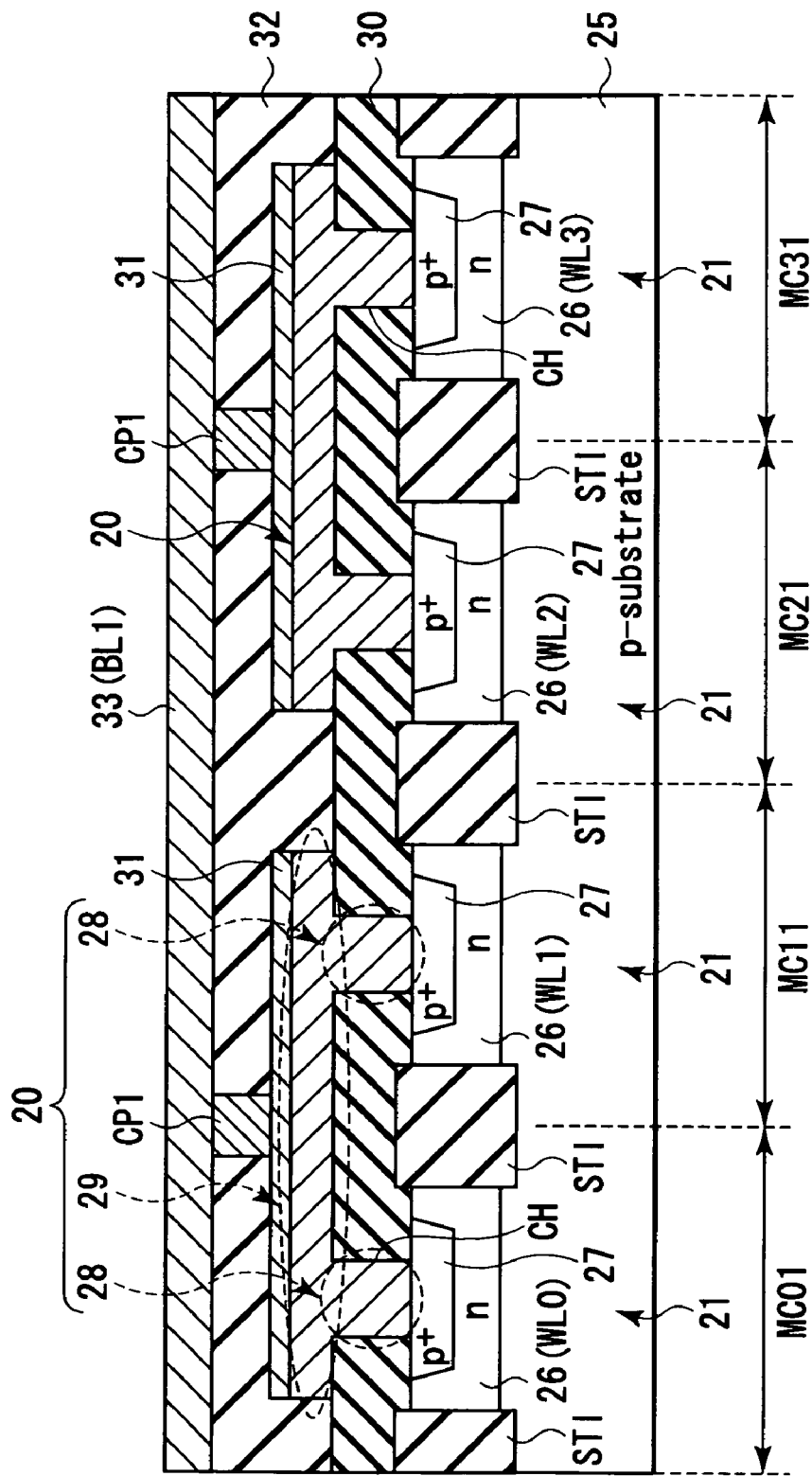
FIG. 3 is a sectional view taken along line 3—3 of FIG. 2.

Referring to FIG. 3, the sectional structure of the memory cell array 11 will be described. FIG. 3 is a sectional view taken along line 3—3 of FIG. 2.

As seen from FIG. 3, the element isolation region STI is formed in the p-type semiconductor substrate 25, and the switching transistors 21 are provided in the element regions AA defined by the element isolation region STI. Each switching transistor 21 comprises the p-type semiconductor substrate 25, n-type impurity diffusion layer 26 formed in the surface of the substrate 25, and $p^+$-type impurity diffusion layer 27 formed in the surface of the layer 26. As described above, the respective regions function as the collector region, base region and emitter region of each pnp bipolar transistor. The collector regions 25 of the switching transistors 21 are connected to each other, and connected to, for example, ground. The base regions 26 of the switching transistors 21 arranged in the same row are connected to each other. Further, the base regions 26 corresponding to different columns are electrically isolated from each other. The emitter regions 27 are electrically isolated in units of switching transistors. The base regions of the switching transistors 21 arranged in the same row may be connected to each other by the n-type impurity diffusion layer 26 or by a metal wiring layer additionally provided.

An interlayer insulation film 30 is formed on the semiconductor substrate 25 so that it covers the switching transistors 21. Contact holes CH are made in the interlayer insulation film 30 so that they extend from the surface of the film 30 to the respective emitter regions 27. The phase-change elements 20 are provided on the interlayer insulation film 30, filling the contact holes CH. The phase-change elements 20 are formed of a material that shows an amorphous-crystalline phase change, for example, GeTeSb. As mentioned above, each phase-change element 20 includes the first and second regions 28 and 29. The first region 28 is provided for each memory cell, filling each contact hole CH and reaching each emitter region 27 at the bottom of each contact hole. The second region 29 is provided on the interlayer insulation film 30 in contact with each pair of adjacent first regions 28.

An electrode 31 is provided on the second region 29 of each phase-change element 20. An interlayer insulation film 32 is provided on the interlayer insulation film 30 so that it covers the phase-change elements 20. Contact plugs CP1 connected to the electrodes 31 are provided in the interlayer insulation film 32. A metal wiring layer 33 is provided on the interlayer insulation film 32 so that it connects the contact plugs CP1 of the same column to each other. The metal wiring layer 33 functions as a bit line BL.

Figure 4:
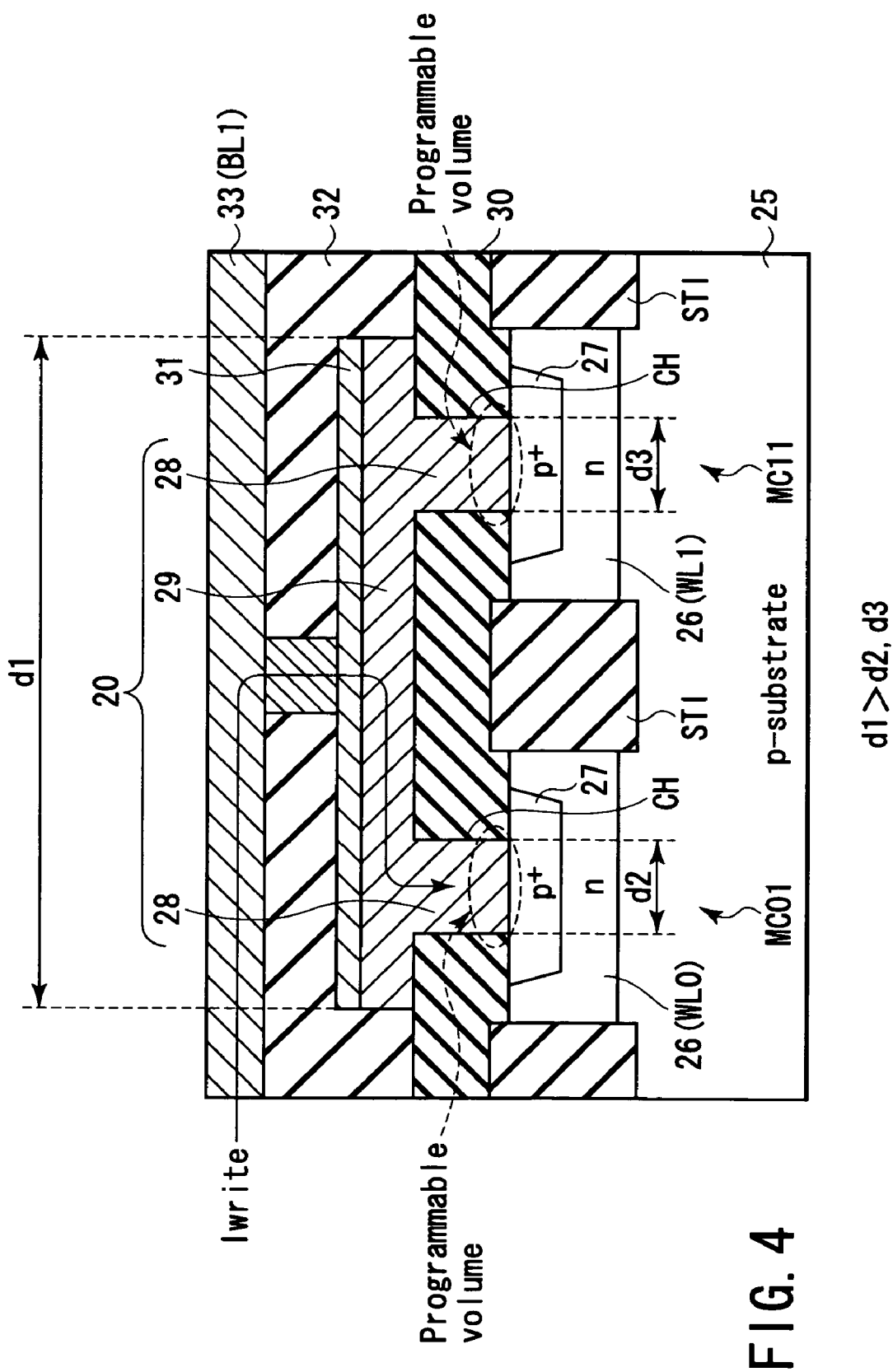
FIG. 4 is an enlarged view illustrating part of the section of FIG. 3.

FIG. 4 is an enlarged view illustrating part of the section of FIG. 3. As shown, the upper surface of the second regions 29 of the phase-change element 20 are in contact with the electrode 31, the contact area therebetween being assumed as d1. The bottoms of the first regions 28 of the phase-change element 20 reach the emitter regions 27, the respective contact areas therebetween being assumed as d2 and d3. In this case, d1>d2, d3. This means that the phase-change element 20 is formed so that the contact area of the element 20 and each emitter region 27 is smaller than that of the element 20 and electrode 31 connected to the bit line.

Accordingly, the contact resistance of the phase-change element 20 and each emitter region 27 is higher than that of the element 20 and electrode 31. In other words, a greater part of the Joule heat obtained when a current is supplied to the phase-change element 20 is generated in the contact regions of the element 20 and emitter regions 27, rather than in the contact region of the element 20 and electrode 31. Therefore, the region in which a change of phase occurs during writing of data, i.e., the programmable volume, is the contact region of the element 20 and each emitter region 27.

The operations of the phase-change memory device constructed as above will be described.

Figure 5:
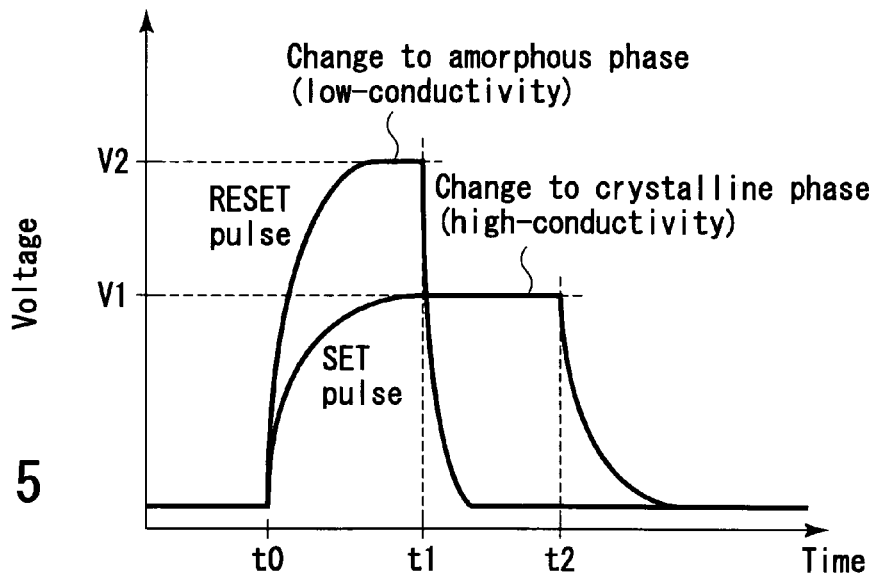
FIG. 5 is a graph illustrating a voltage pulse applied to the phase-change memory device of the first embodiment when data is written thereto.

Referring to FIGS. 1, 4 and 5, write operations will be described firstly. FIG. 5 is a timing chart illustrating write voltages applied to a bit line when data is written. In this case, assume that data is written into the memory cell MC01 located at the intersection of the bit line BL1 and word line WL0.

In the write operations, part of the phase-change element 20 is heated by applying a voltage pulse to each bit line. The Joule heat generated in the heated part of the element 20 changes the part to the crystalline phase or amorphous phase.

<Write Operation 1: Change to Crystalline State (Set)>

Firstly, the row decoder 15 selects the word line WL0 based on a row address decode signal, and applies 0 V to the selected word line WL0 and a high-level voltage to the other non-selected word lines WL1 to WLm.

Subsequently, the bit-line driver 14 selects the bit line BL1 based on a column address decode signal, and applies a voltage pulse (set pulse) to the bit line BL1.

As shown in FIG. 5, the set pulse is a voltage pulse having a voltage value of V1 and a pulse width of t2. To change the phase-change element 20 from the amorphous state to the crystalline state, the voltage pulse is applied thereto for a predetermined time, thereby creating a current path in the phase-change element 20 as shown in FIG. 4. At this time, since the base of the switching transistor 21 of the memory cell MC01 is at 0 V, the writing current $I_{write}$ flows from the bit line BL1 to the collector of the switching transistor 21. When the flow of the current is continued, Joule heat is generated in the contact region of the phase-change element 20 and emitter region 27 of the switching transistor 21. This Joule heat causes the atoms in the region of the phase-change element 20 that contacts the emitter region 27 to be rearranged (i.e., a change of phase occurs). As a result, the region of the phase-change element 20 that contacts the emitter region 27 changes to the crystalline state.

At this time, the resistance of the phase-change element 20 is reduced and data writing is finished.

<Write Operation 2: Change to Amorphous State (Reset)>

Firstly, the row decoder 15 selects the word line WL0 based on a row address decode signal, and applies 0 V to the selected word line WL0 and a high-level voltage to the other non-selected word lines WL1 to WLm.

Subsequently, the bit-line driver 14 selects the bit line BL1 based on a column address decode signal, and applies a voltage pulse (reset pulse) to the bit line BL1.

As shown in FIG. 5, the reset pulse is a sharp voltage pulse having a voltage value of V2 (>V1) and a pulse width of t1 (<t2). When the reset pulse is applied, the phase-change element 20 is heated to a melting point or more. As a result, the crystal of the phase-change element 20 is melted. At a time t1, the reset pulse falls, whereby the temperature of the phase-change element 20 is reduced. The rate of temperature reduction corresponds to that of temperature increase. Since the temperature of the element 20 is abruptly increased, it abruptly reduces. This abrupt temperature reduction brings about a supercooled liquid state and then an amorphous phase.

As described above, the region of the phase-change element 20 that contacts the emitter region 27 is changed to the amorphous state by abruptly cooling the element 20. As a result, the resistance of the phase-change element 20 is increased and data writing is finished.

<Read Operation>

Referring then to FIGS. 1 and 4, a read operation will be described. The read operation is realized by applying, to each bit line, such a low voltage pulse as will not cause the phase-change element 20 to raise a phase change, and reading the resistance of the element 20. In this embodiment, a description will be given of the case where data is read from the memory cell MC01.

Firstly, the row decoder 15 selects the word line WL0 based on a row address decode signal, and applies 0 V to the selected word line WL0 and a high-level voltage to the other non-selected word lines WL1 to WLm.

Subsequently, the bit-line driver 14 selects the bit line BL1 based on a column address decode signal, and applies a voltage pulse (<V1, V2) to the bit line BL1. At this time, if the phase-change element 20 is in the reset state, i.e., if the region of the element 20 that contacts the emitter region 27 is in the amorphous state, little current flows. On the other hand, if the phase-change element 20 is in the set state, i.e., if the region of the element 20 that contacts the emitter region 27 is in the crystalline state, a large current flows. The sense amplifier 14 amplifies a change in the potential of the bit line BL1, which is the termination of data reading.

The phase-change memory device according to first embodiment of the present invention provides the following advantages:

(1) The chip size can be reduced, and the manufacturing process can be simplified. These advantages will be explained in more detail.

As shown in FIGS. 2 to 4, the phase-change element 20 is commonly used by two memory cells MC. Accordingly, the patterning process is easier and higher integration of memory cells can be realized than in the case where the second region 29 is provided for each memory cell.

Further, since the phase-change element 20 is commonly used by two memory cells MC, it is sufficient if a single contact plug CP1 is employed for the bit line BL1 in units of two memory cells MC. This facilitates the patterning of the contact plugs CP1 and enhances the integration of memory cells.

(2) The power consumption of the phase-change memory device can be reduced. This will be explained in more detail.

In the structure employed in the above embodiment, the phase-change element 20 is in contact with the electrode 31 and switching transistor 21 located above and below the element 20, respectively. In each memory cell, the contact area of the element 20 and transistor 21 is smaller than that of the element 20 and electrode 31. Accordingly, when a voltage pulse is applied during writing, a greater part of the Joule heat obtained in the element 20 is generated in the contact portion of the element 20 and transistor 21. This is because the contact portion of the element 20 and transistor 21 has a higher contact resistance than that of the element 20 and electrode 31.

Thus, Joule heat can be generated locally. In other words, Joule heat can be efficiently generated when a voltage is applied. Therefore, heat sufficient to bring about a change of phase can be obtained by the application of a lower voltage than in the prior art. This means that the power consumption of the phase-change memory device can be reduced.

Figure 6:
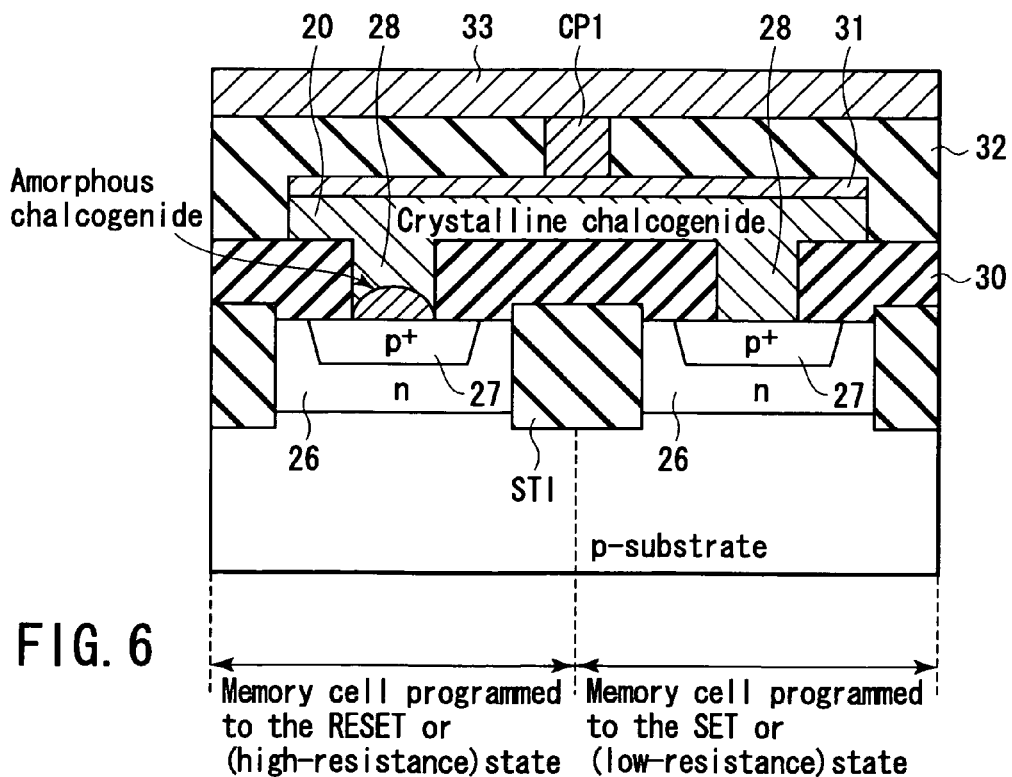
FIG. 6 is a sectional view of the phase-change memory device of the first embodiment.

In the phase-change memory device of the embodiment, two memory cells commonly use a single phase-change element 20. However, as understood from the cross section of a memory cell shown in FIG. 6, only in the region of the element 20 that contacts the switching transistor, does a change of phase occur during writing. That is, only in the second regions 28 of each memory cell, does a phase change occur. Accordingly, when data is written to one of the two memory cells that use a single phase-change element 20, this operation does not influence the other memory cell.

Figure 7:
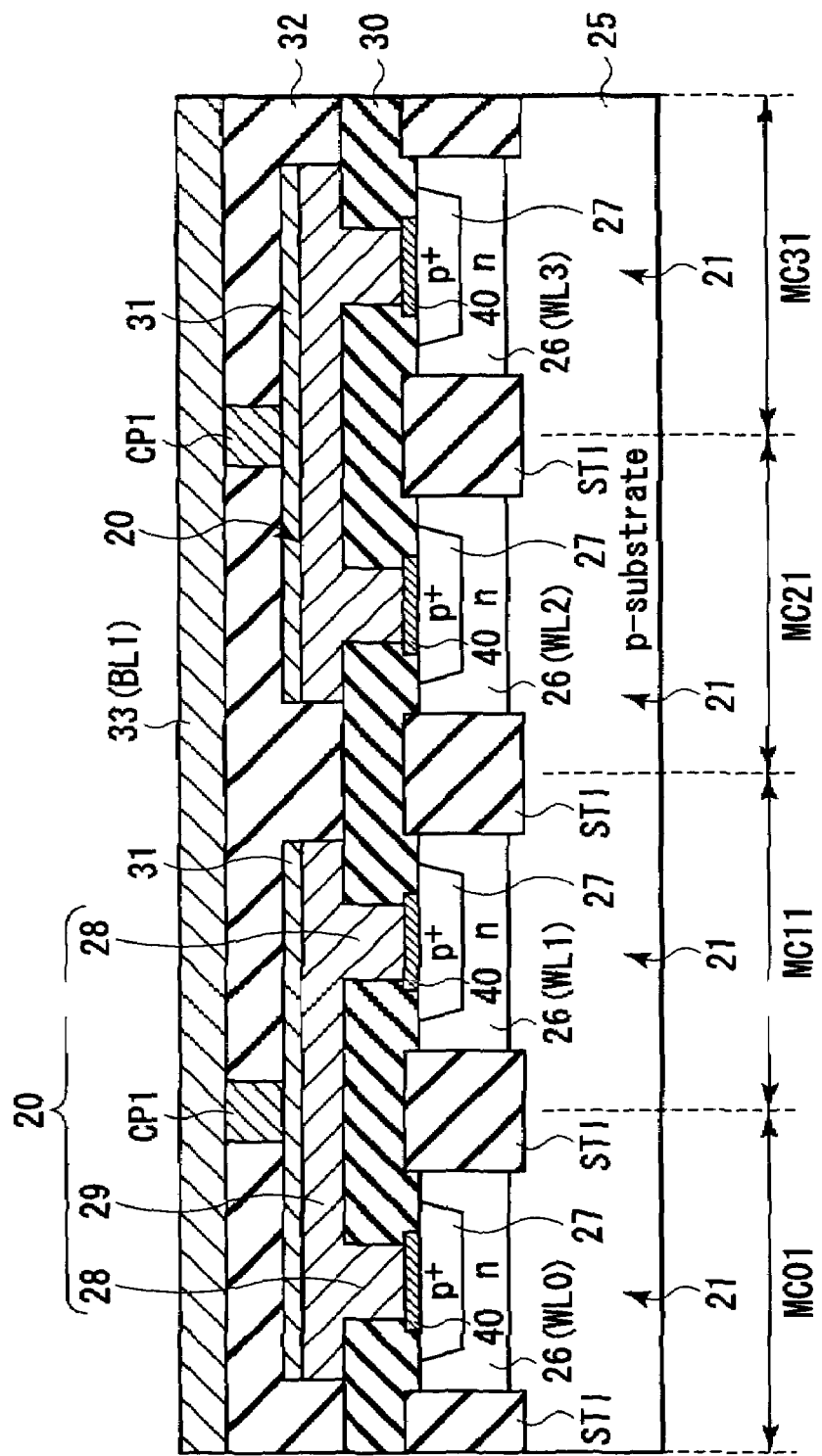
FIG. 7 is a sectional view of a phase-change memory device according to a second embodiment.
Figure 8:
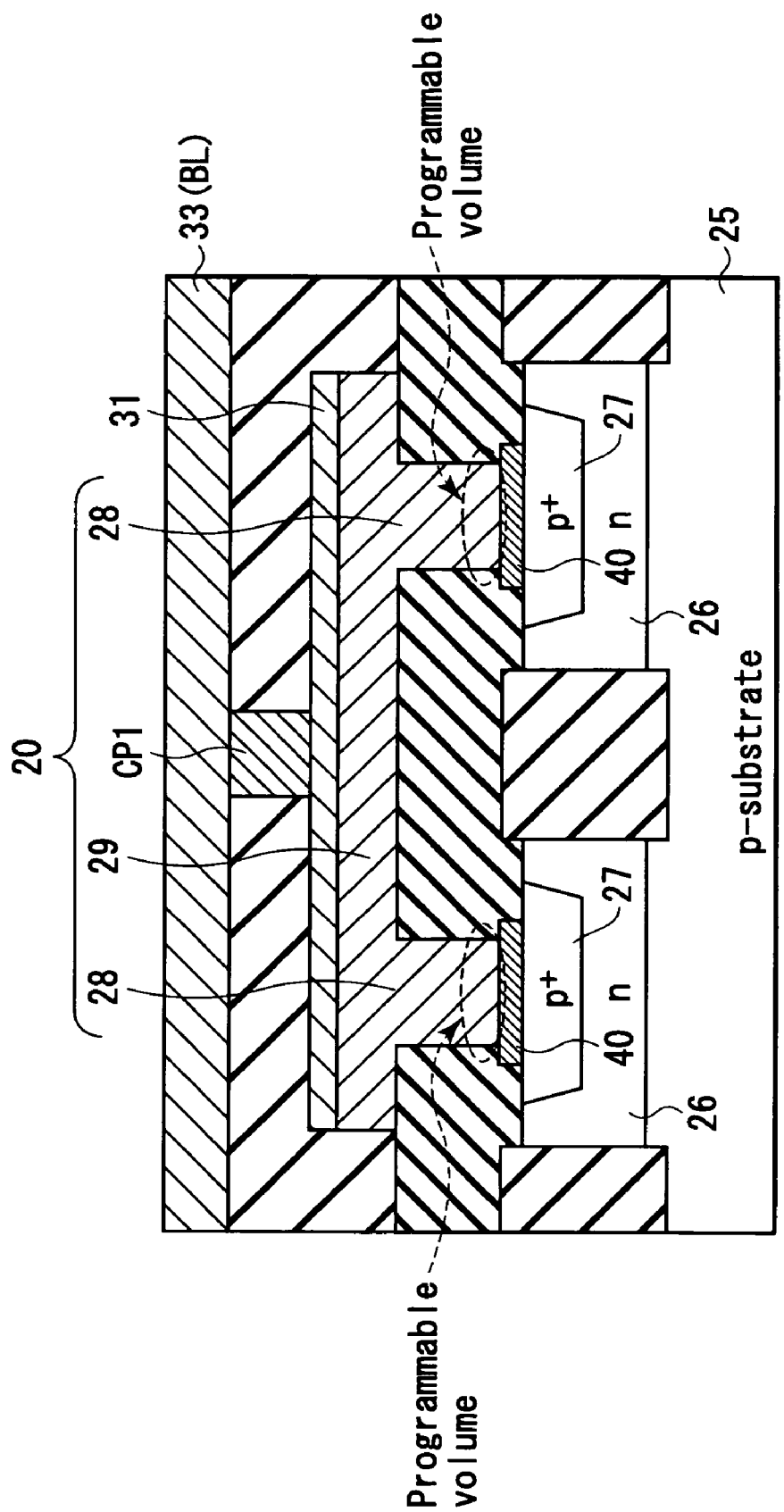
FIG. 8 is an enlarged view illustrating part of the section of FIG. 7.

A phase-change memory device according to a second embodiment will now be described. This memory device differs from the first embodiment in that in the former, an electrode is provided on each contact portion of the phase-change elements 20 and switching transistors 21. FIG. 7 is a sectional view illustrating the memory cell array of the phase-change memory device of the second embodiment. The cross section of FIG. 7 is similar to the cross section taken along line 3—3 of FIG. 2. FIG. 8 is an enlarged view illustrating part of the section of FIG. 7.

As shown in figures, an electrode 40 is provided on the emitter region 27 of each switching transistor 21. Further, each first region 28 of the phase-change element 20 is in contact with the corresponding electrode 40. The upper surface of the electrode 40 is made larger than the bottom of the first region 28. The other structure of the phase-change memory device is similar to that of the first embodiment, therefore no detailed description is given thereof. As a matter of course, the contact area of each first region 28 and electrode 40 is smaller than that the second region 29 and electrode 31.

Furthermore, the operation of the phase-change memory device of the second embodiment is similar to that of the device of the first embodiment. During writing, a change of phase occurs in the region of each first region 28 that contacts the corresponding electrode 40 (see FIG. 8).

The phase-change memory device of the second embodiment provides following advantage 3, in addition to advantages 1 and 2 obtained in the first embodiment:

(3) The reliability of the write operation can be enhanced.

In the phase-change memory device of the second embodiment, the phase-change element 20 is provided on each electrode 40. The electrode 40 is formed of a material, such as a metal, having a lower resistance than the emitter region 27. The entire bottom surface of each first region 28 of the phase-change element 20 is in contact with the corresponding electrode 40. Accordingly, the contact resistance of the bottom of the first region 28 and electrode 40 is substantially uniform in the plane. In other words, in the bottom of the first region 28, Joule heat is generated substantially uniformly. Therefore, during writing, a phase change uniformly occurs in the bottom surface of the first region.

To change the phase-change element 20 from the crystalline phase to the amorphous phase by applying a reset pulse thereto, a change of phase must occur in the entire bottom surface of the first region 28. If a region of crystalline phase, which has a low resistance, remains in the bottom surface of the element 20, a current path is formed through this region (even if this region is small), when a read voltage pulse is applied during reading. In light of this, it is necessary to bring about a phase change in the entire bottom surface of the first region 28.

As described above, in the phase-change memory device of the second embodiment, Joule heat is uniformly generated in the bottom surface of the first region of the phase-change element 20 that contacts the switching transistor. Consequently, the phase change occurs in the bottom surface of the first region.

Thus, the phase-change memory device of the second embodiment is highly reliable in write operation, in particular, in resetting memory cells (in changing memory cells to the amorphous state).

Figure 9:
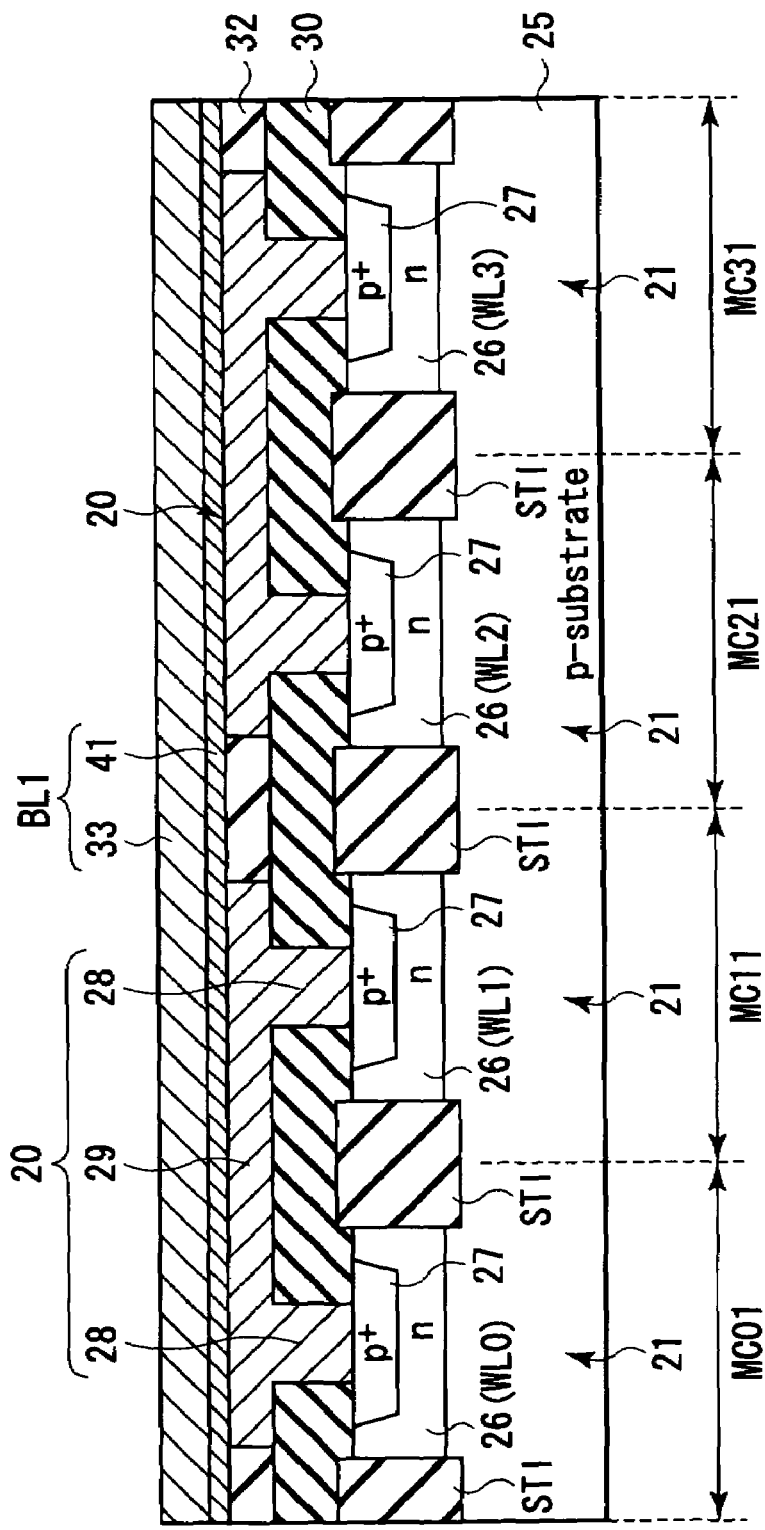
FIG. 9 is a sectional view of a phase-change memory device according to a third embodiment.

A phase-change memory device according to a third embodiment will be described. The third embodiment differs from the first embodiment in that the former does not employ the contact plugs CP1. FIG. 9 is a sectional view illustrating the memory cell array of the phase-change memory device of the third embodiment. The cross section of FIG. 9 is similar to the cross section taken along line 3—3 of FIG. 2.

As seen from FIG. 9, a metal wiring layer serving as a bit line has a multi-layer structure that includes a first wire 41 formed of, for example, TiW, and a second wire 33 formed of, for example, aluminum (Al) or copper (Cu), provided on the first wire 41 and having a lower resistance than the first wire 41. The bottom of the first wire 41 is in contact with the entire upper surface of the second region 29 of the phase-change element 20. The other structure is similar to that of the first embodiment.

The operation of the second embodiment is similar to that of the first embodiment, and therefore no description is given thereof.

The phase-change memory device of the third embodiment provides following advantage 4, in addition to advantages 1 and 2 described in the first embodiment:

(4) This device shows high operational reliability.

In the phase-change memory device of the third embodiment, each phase-change element 20 is directly connected to the corresponding bit line without the contact plugs, and the entire upper surface of the second region 29 of each phase-change element 20 is in contact with the corresponding bit line. Accordingly, compared to the first and second embodiments, the contact resistance of the phase-change elements 20 and bit lines BL can be significantly reduced. As a result, the phase-change memory device of the third embodiment can have high operational reliability.

Figure 10:
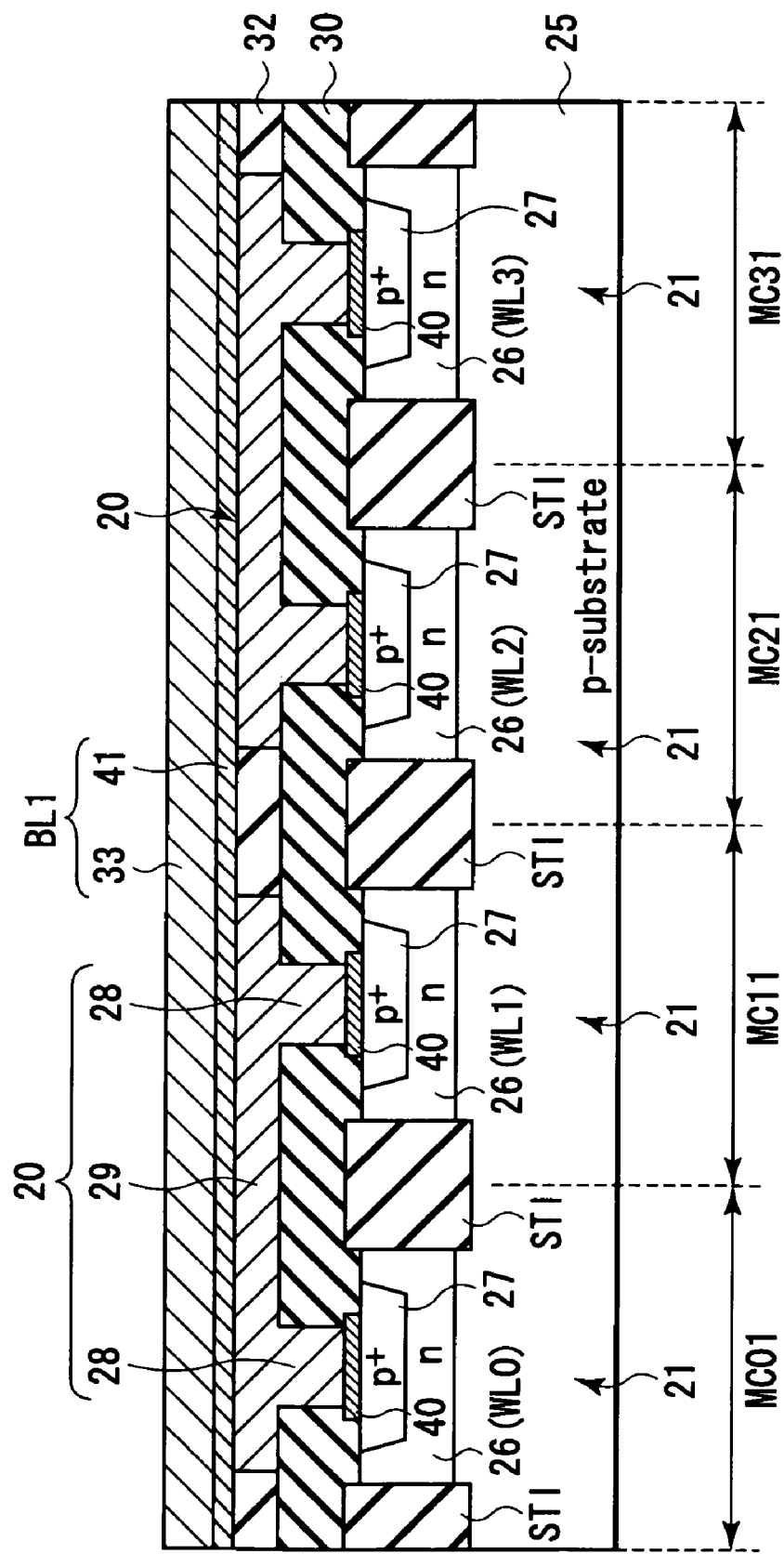
FIG. 10 is a sectional view of a phase-change memory device according to a modification of the third embodiment.

FIG. 10 is a sectional view of a phase-change memory device according to a modification of the third embodiment. This modification is obtained by combining the second and third embodiments. Specifically, as shown in FIG. 10, an electrode 40 is provided on the emitter region 27 of each switching transistor 21. Further, each first region 28 of the phase-change element 20 is provided on the corresponding electrode 40.

The phase-change memory device of the modification of the third embodiment provides the same advantage 3 as the second embodiment, in addition to advantages 1, 2 and 4.

Figure 11:
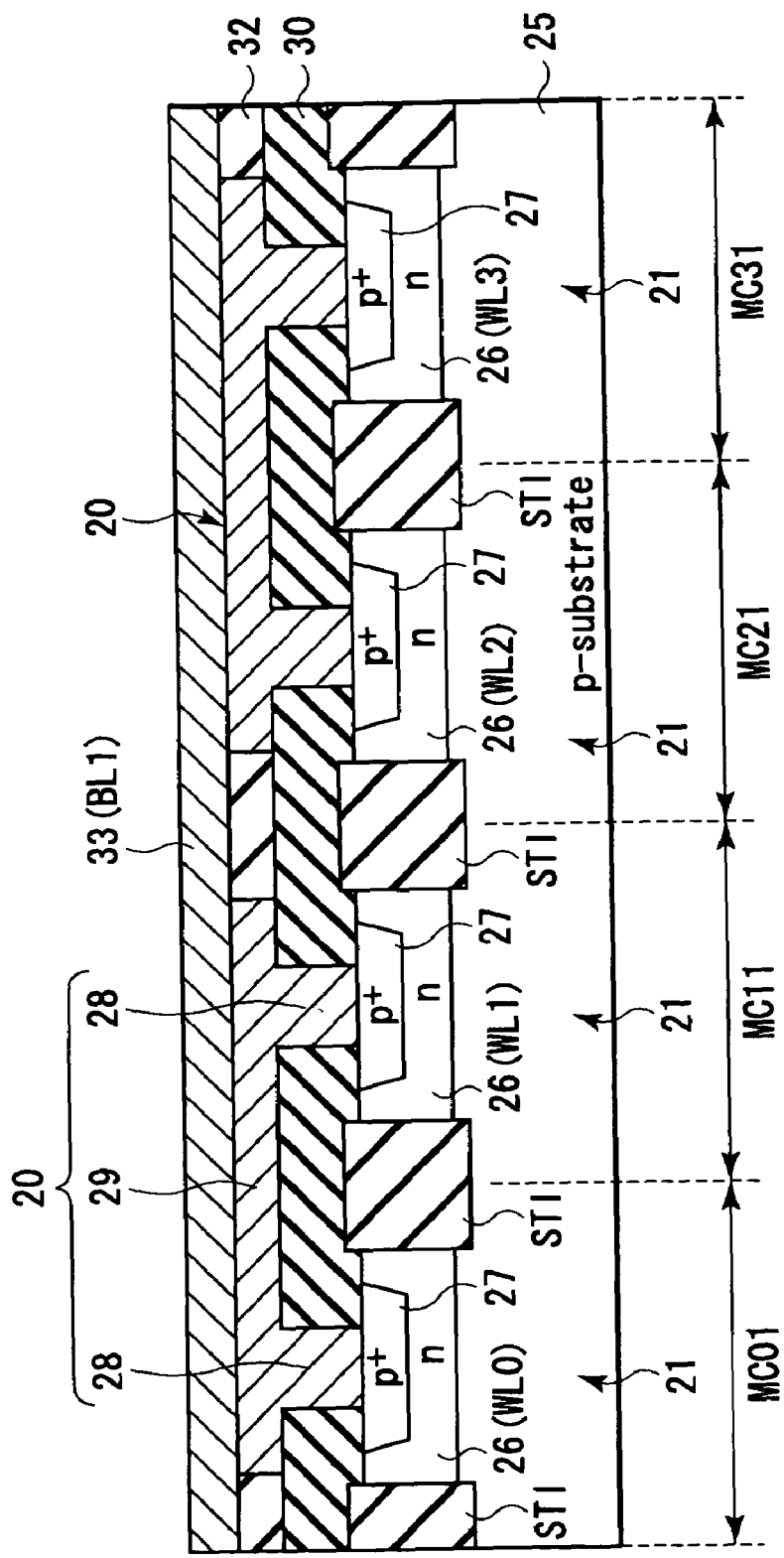
FIG. 11 is a sectional view of a phase-change memory device according to a fourth embodiment.

A phase-change memory device according to a fourth embodiment will be described. The fourth embodiment differs from the third embodiment in that in the former, each bit line is formed of a single metal wire layer. FIG. 11 is a sectional view illustrating the phase-change memory device of the fourth embodiment. The cross section of FIG. 11 is similar to the cross section taken along line 3—3 of FIG. 2.

As shown, the phase-change memory device of the fourth embodiment differs from the third embodiment in that the former does not employ the first wire 41.

The phase-change memory device of the fourth embodiment provides following advantage 5, in addition to above-mentioned advantages 1, 2 and 4:

(5) The manufacturing process can be further simplified.

In the phase-change memory device of the fourth embodiment, each bit line BL is formed of the single metal wire layer 33. Therefore, the manufacturing process can be more simplified than in the third embodiment. This will be explained in detail.

The phase-change element 20 is formed of, for example, a chalcogenide compound. More specifically, a binary compound, such as GaSb, a ternary compound, such as GeSbTe, or a quaternary compound, such as AgInSbTe, etc. can be used as the chalcogenide compound. Further, the bit lines are formed of a low-resistance metal, such as Al or Cu. It may be difficult to join such a low-resistance metal to a chalcogenide compound with a low contact resistance. In light of this, it is necessary to make the bit lines BL have a multi-layer structure, as described in the third embodiment. That is, the first wire 41 is formed of a material that has an affinity for chalcogenide compounds in view of contact, and the second wire 33 formed of a low-resistance metal is provided on the first wire 41.

However, if a low-resistance material that can be brought into low-resistance contact with chalcogenide compounds is used as the material of the bit lines, the first wire 41 employed in the third embodiment is not needed. In other words, the second wire 33 can be directly provided on the phase-change element 20 as in the fourth embodiment. The combination of a bit line material and chalcogenide compound, which can realize such a junction as the above, is, for example, the combination of TiW and $Ge_2Sb_2Te_5$.

The expression "the bit lines are formed of a single metal layer" used in the fourth embodiment means, of course, that the layer (buffer layer) that enables a chalcogenide compound to be joined with a low resistance is not needed. Accordingly, the bit lines may have a laminated structure that includes, for example, a barrier metal film and metal diffusion preventing film.

Figure 12:
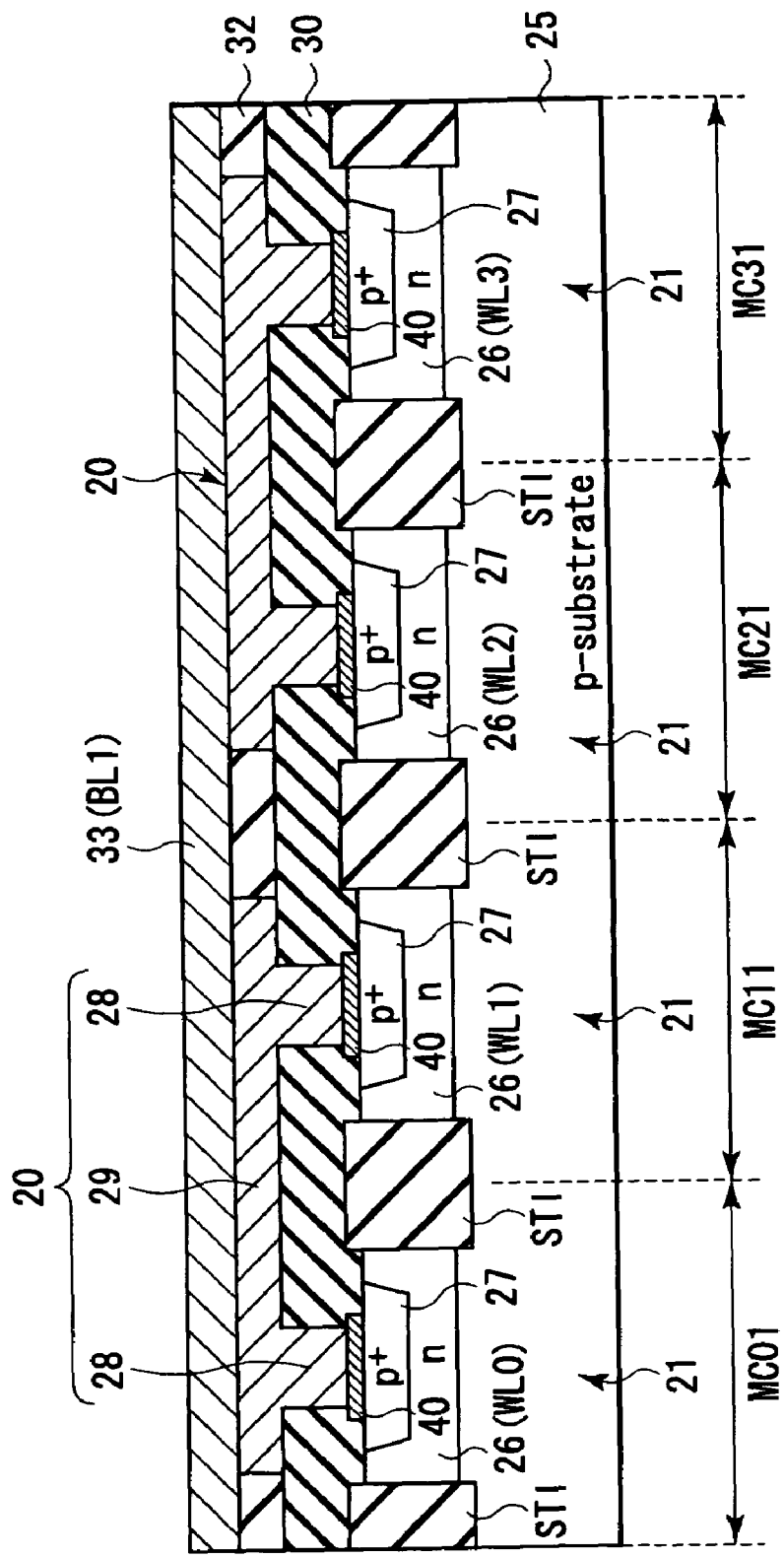
FIG. 12 is a sectional view of a phase-change memory device according to a modification of the fourth embodiment.

FIG. 12 is a sectional view of a phase-change memory device according to a modification of the fourth embodiment. This modification is a combination of the second and fourth embodiments. Specifically, as shown in FIG. 12, this modification differs from the fourth embodiment in that in the former, an electrode 40 is provided on the emitter region 27 of each switching transistor 21. Further, each first region 28 of each phase-change element 20 is provided on the corresponding electrode 40.

This modification provides the same advantage 3 as the second embodiment, in addition to advantages 1, 2, 4 and 5.

Figure 13:
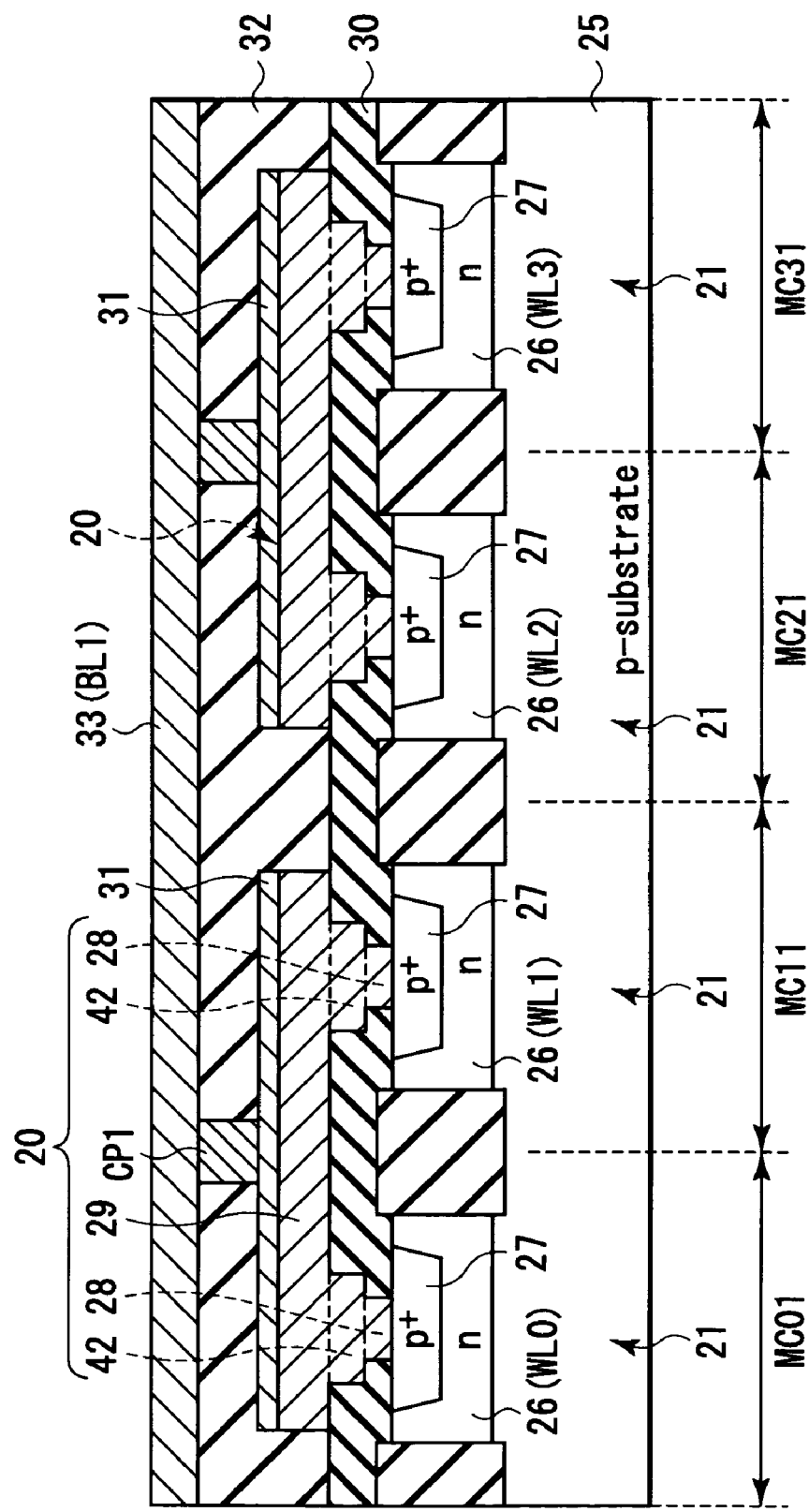
FIG. 13 is a sectional view of a phase-change memory device according to a fifth embodiment.
Figure 14:
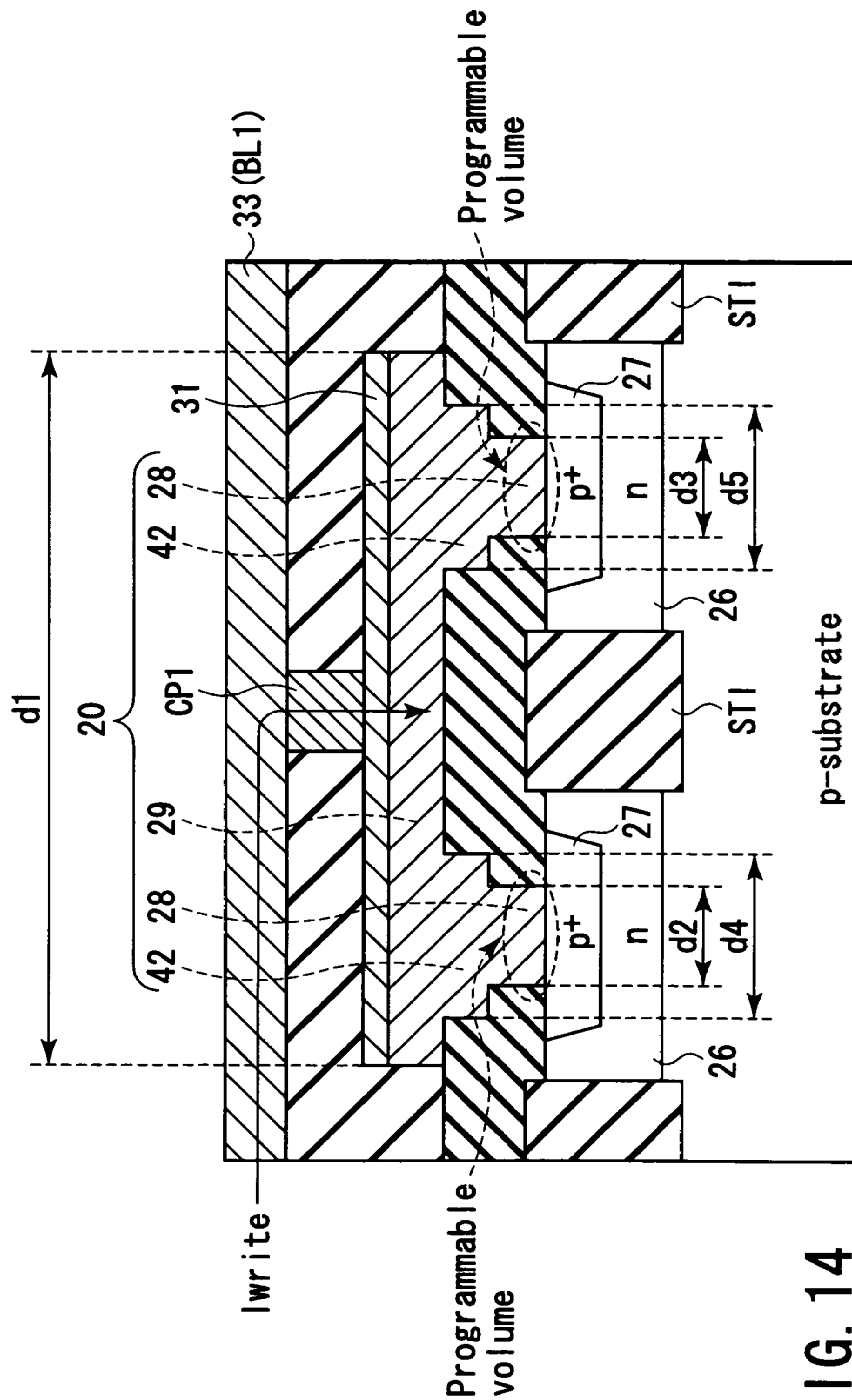
FIG. 14 is an enlarged view illustrating part of the section of FIG. 13.

A phase-change memory device according to a fifth embodiment will be described. The fifth embodiment differs from the first embodiment in that in the former, a third region wider than the first region 28 is provided between the first and second regions 28 and 29 of each phase-change element 20. FIG. 13 is a sectional view illustrating the phase-change memory device of the fifth embodiment. The cross section of FIG. 13 is similar to the cross section taken along line 3—3 of FIG. 2. FIG. 14 is an enlarged view illustrating part of the section of FIG. 13.

As shown in FIGS. 13 and 14, each phase-change element 20 further comprises third regions 42. Specifically, as shown in FIG. 14, third regions 42 that have respective widths (cross sections) d4 and d5 larger than those d2 and d3 of the first regions 28 are provided on the respective first regions 28. The second region 29 is provided on the third regions 42 (d1>d4, d5>d2, d3). In other words, each column portion of the phase-change element 20 connected to the emitter region 27 of the corresponding switching transistor 21 has its cross section narrowed stepwise as it is closer to the transistor 21. The bottom of each column portion that has the minimum cross section contacts the emitter region 27. The other structure of the fifth embodiment is similar to that of the first embodiment.

The operation of the fifth embodiment is also similar to that of the first embodiment. Therefore, no description is given thereof.

The phase-change memory device of the fourth embodiment provides following advantage 6, in addition to advantages 1 and 2 described in the first embodiment:

(6) The reliability of the write operation of the phase-change memory device can be further enhanced.

In the first embodiment, the first regions 28 are directly connected to the second region 29. Accordingly, a phase change may occur in the entire first regions 28 and further in the second region 29, as well as in the portions of the first regions that contact the emitter regions 27.

However, in the fifth embodiment, each first region 28 is connected to the second region 29 via the corresponding third region 42 wider than each first region. More specifically, each first region 28 is connected to the second region 29 via the corresponding third region 42 having a greater width than each first region and a lower resistance than the second region. Since the third region 42 has a low resistance, little Joule heat is generated therein. This means that a phase change does not easily occur in the third region 42. Thus, the region in which a phase change occurs is limited to the first regions 28. Therefore, the reliability of the write operation is enhanced.

Figure 15:
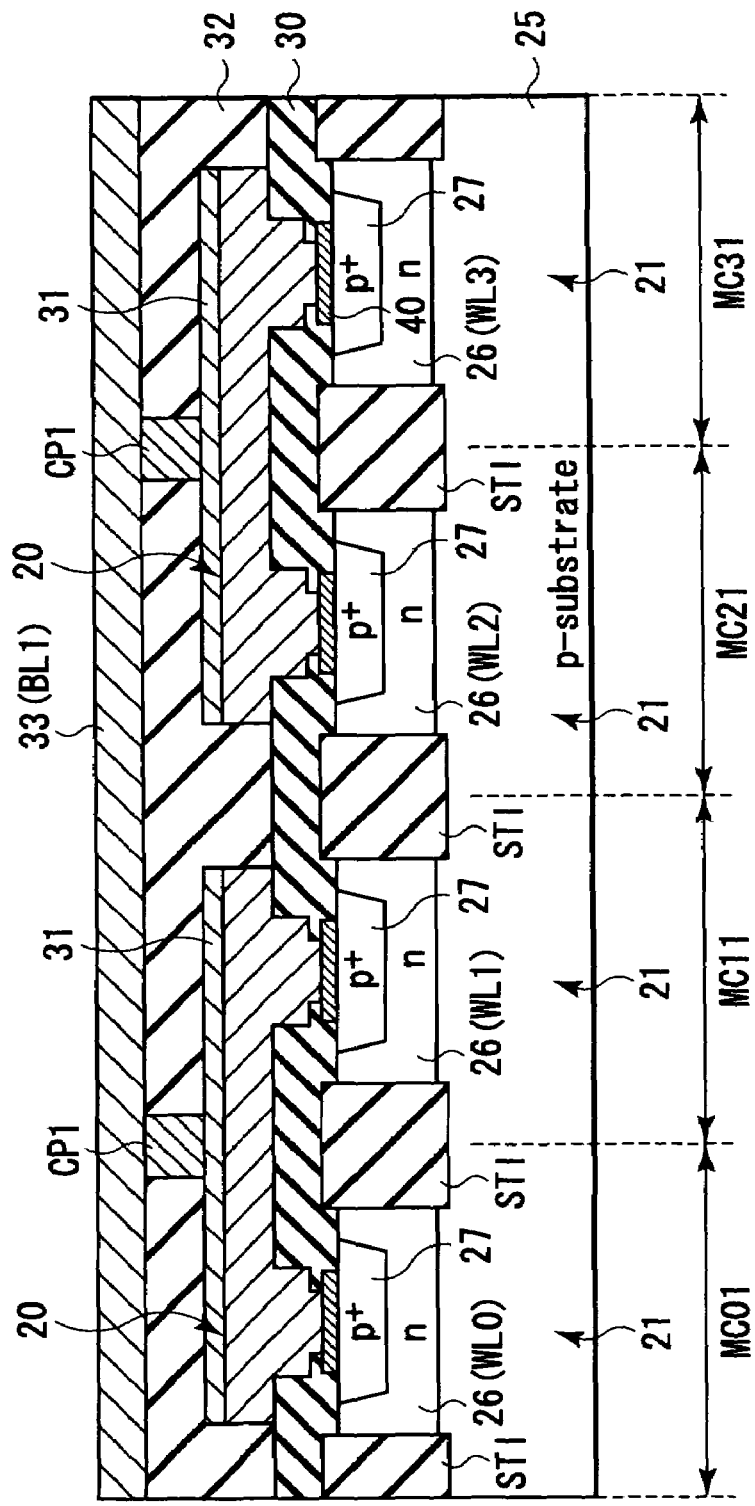
FIGS. 15 to 19 are sectional views of phase-change memory devices according to first to fifth modifications of the fifth embodiment.

FIG. 15 is a sectional view of a phase-change memory device according to a first modification of the fifth embodiment. The first modification is a combination of the second and fifth embodiments. Specifically, as shown in FIG. 15, the first modification differs from the fifth embodiment in that in the former, an electrode 40 is provided on the emitter region 27 of each switching transistor 21, and each first region 28 of each phase-change element 20 is provided on the corresponding electrode 40.

This modification provides the same advantage 3 as the second embodiment, in addition to advantages 1, 2 and 6.

Figure 16:
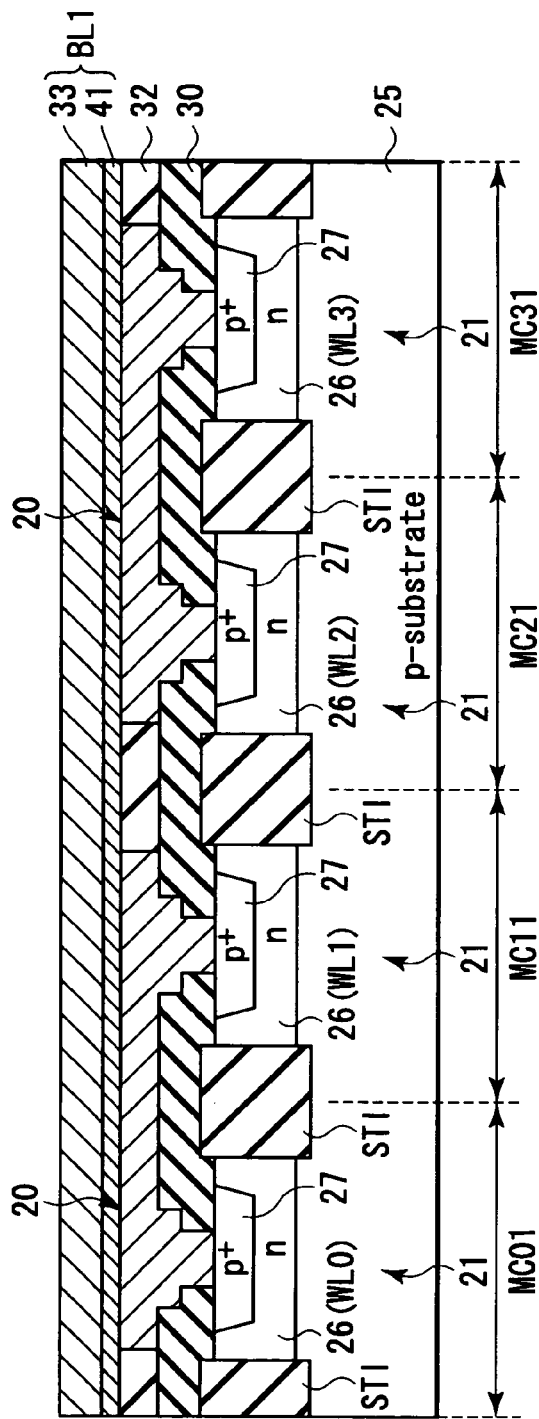

FIG. 16 is a sectional view of a phase-change memory device according to a second modification of the fifth embodiment. This modification is a combination of the third and fifth embodiments. Specifically, as shown in FIG. 16, the second modification differs from the fifth embodiment in that in the former, no contact plugs CP1 are incorporated and the bit lines BL have a multi-layer structure that includes metal wire layers 41 and 33. The metal wire layer 33 is formed of a low-resistance metal, and the metal wire layer 41 is formed of a material that shows a high adhesiveness to chalcogenide compounds.

The second modification provides the same advantage 4 as the third embodiment, in addition to advantages 1, 2 and 6.

Figure 17:
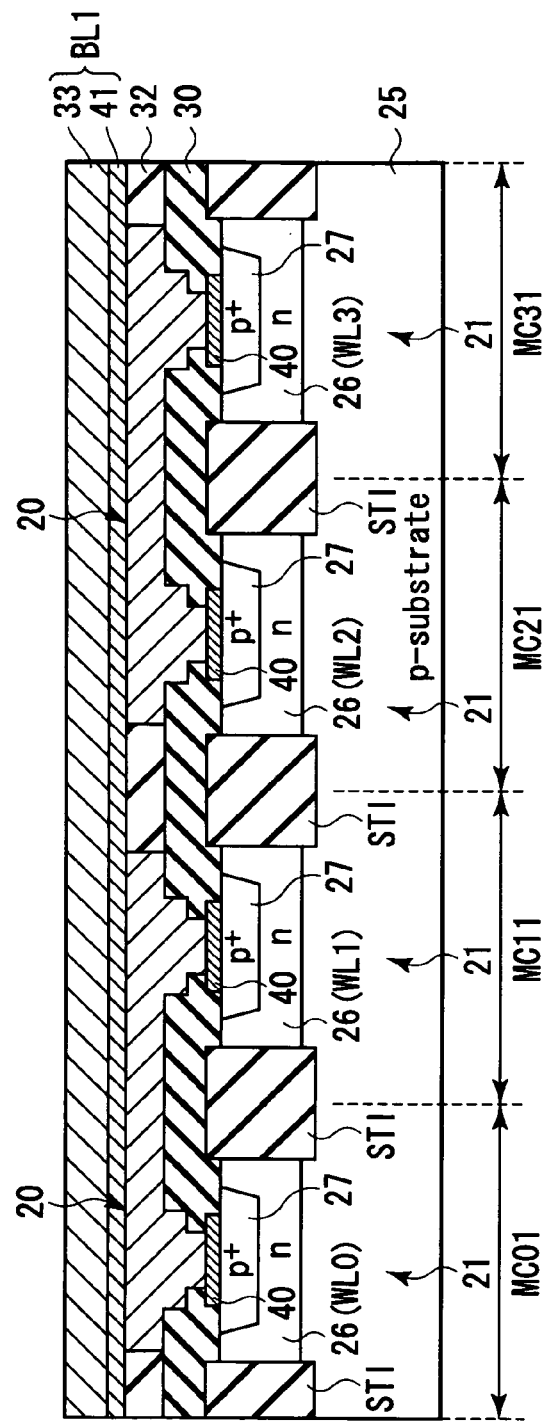

FIG. 17 is a sectional view of a phase-change memory device according to a third modification of the fifth embodiment. The third modification is a combination of the second, third and fifth embodiments. Specifically, as shown in FIG. 17, the third modification differs from the second modification of the fifth embodiment shown in FIG. 16, in that in the former, an electrode 40 is provided on the emitter region 27 of each switching transistor 21, and each first region 28 of each phase-change element 20 is provided on the corresponding electrode 40.

This modification provides the same advantages 3 and 4 as the second and third embodiments, in addition to advantages 1, 2 and 6.

Figure 18:
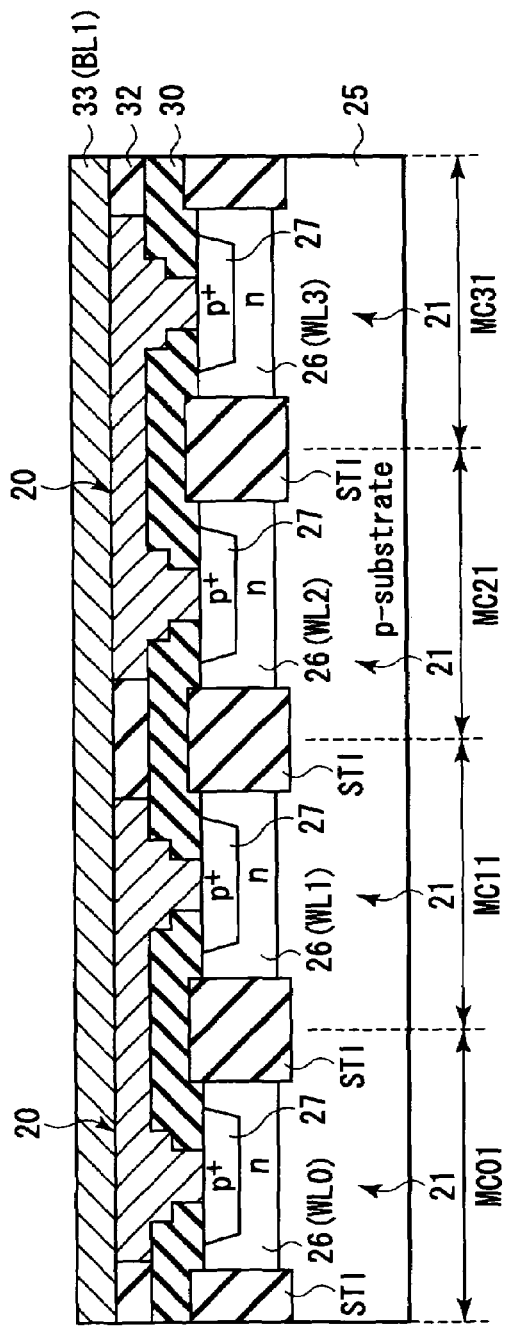

FIG. 18 is a sectional view of a phase-change memory device according to a fourth modification of the fifth embodiment. The fourth modification is a combination of the fourth and fifth embodiments. Specifically, as shown in FIG. 18, the fourth modification differs from the fifth embodiment in that in the former, no contact plugs CP1 are incorporated and the bit lines BL are each formed of a low-resistance metal wire layer 33 that shows a high adhesiveness to chalcogenide compounds.

The fourth modification provides the same advantages 4 and 5 as the third and fourth embodiments, in addition to advantages 1, 2 and 6.

Figure 19:
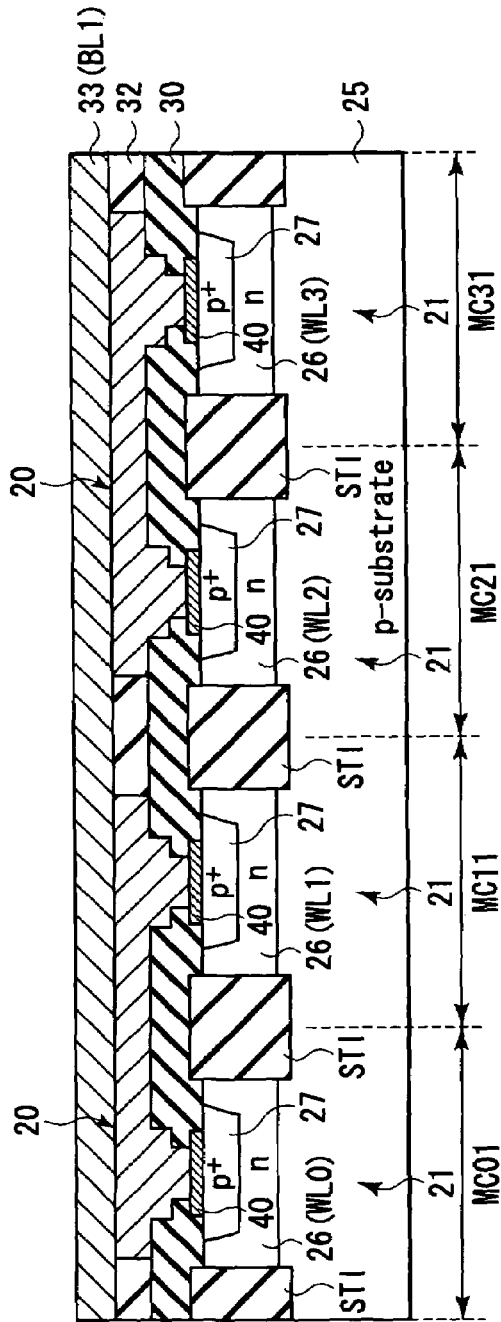

FIG. 19 is a sectional view of a phase-change memory device according to a fifth modification of the fifth embodiment. The fifth modification is a combination of the second, fourth and fifth embodiments. Specifically, as shown in FIG. 19, the fifth modification differs from the fourth modification of the fifth embodiment shown in FIG. 18, in that in the former, an electrode 40 is provided on the emitter region 27 of each switching transistor 21, and each first region 28 of each phase-change element 20 is provided on the corresponding electrode 40.

The fifth modification provides the same advantages 3 to 5 as the second to fourth embodiments, in addition to advantages 1, 2 and 6.

Figure 20:
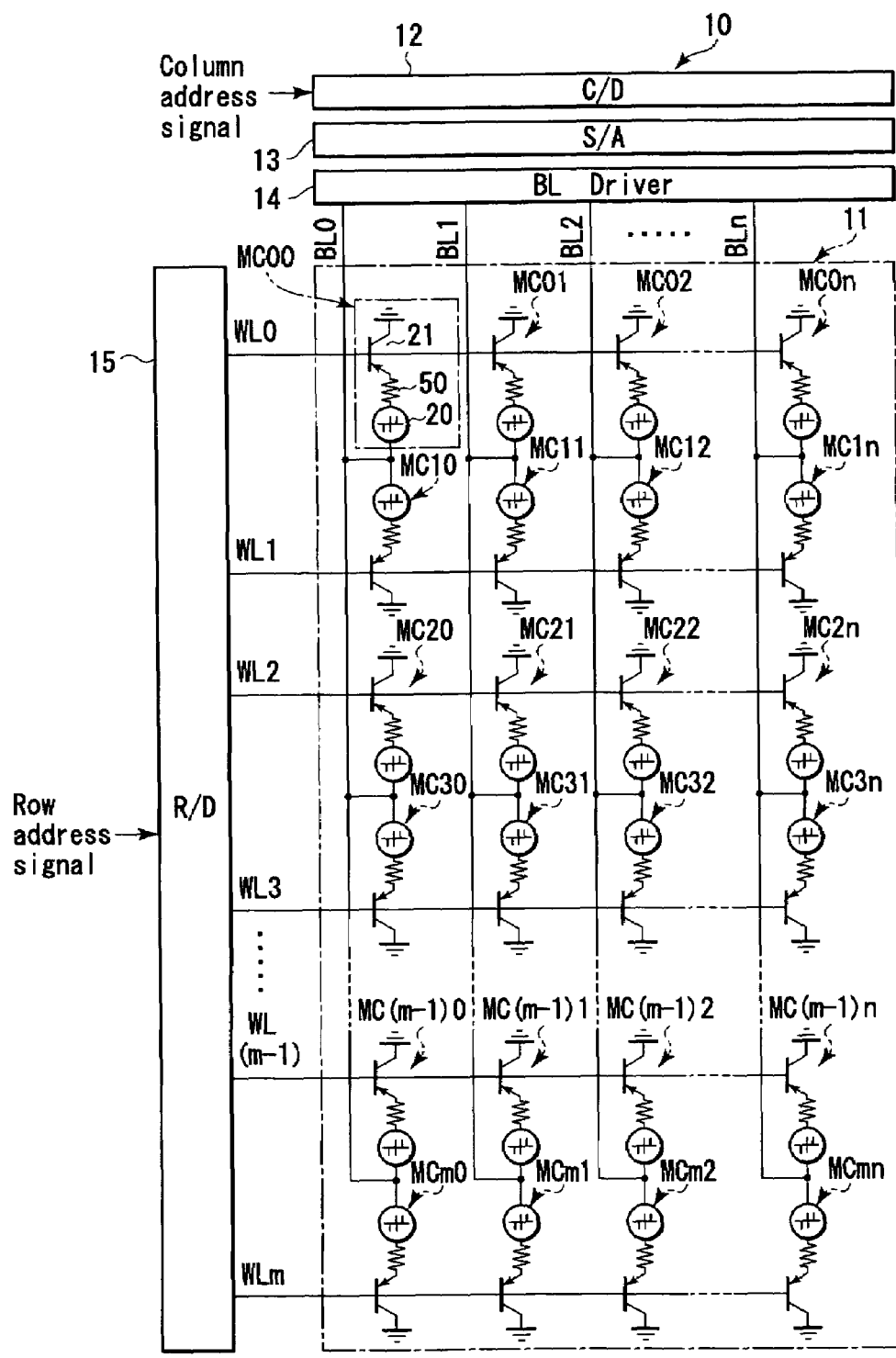
FIG. 20 is a block diagram of a phase-change memory device according to a sixth embodiment.

A phase-change memory according to a sixth embodiment of the invention will be described. The sixth embodiment differs from the first embodiment in that in the former, each memory cell MC has a resistor element as well as the phase-change element and switching transistor. FIG. 20 is a block diagram illustrating the phase-change memory of the sixth embodiment.

As shown in FIG. 20, each memory cell MC has a phase-change element 20, switching transistor 21 and resistor element 50. One end of the resistor element 50 is connected to one end of the phase-change element 20, and the other end of the element 50 is connected to the emitter of the switching transistor 21. The other end of the phase-change element 20 is connected to the corresponding bit line BL.

The plan view of the memory cell array of the phase-change memory device according to the sixth embodiment is substantially the same as FIG. 2 if each first region 28 of each phase-change element 20 is replaced with the resistor element 50 in FIG. 2. Therefore, no description is given of the plan view.

Figure 21:
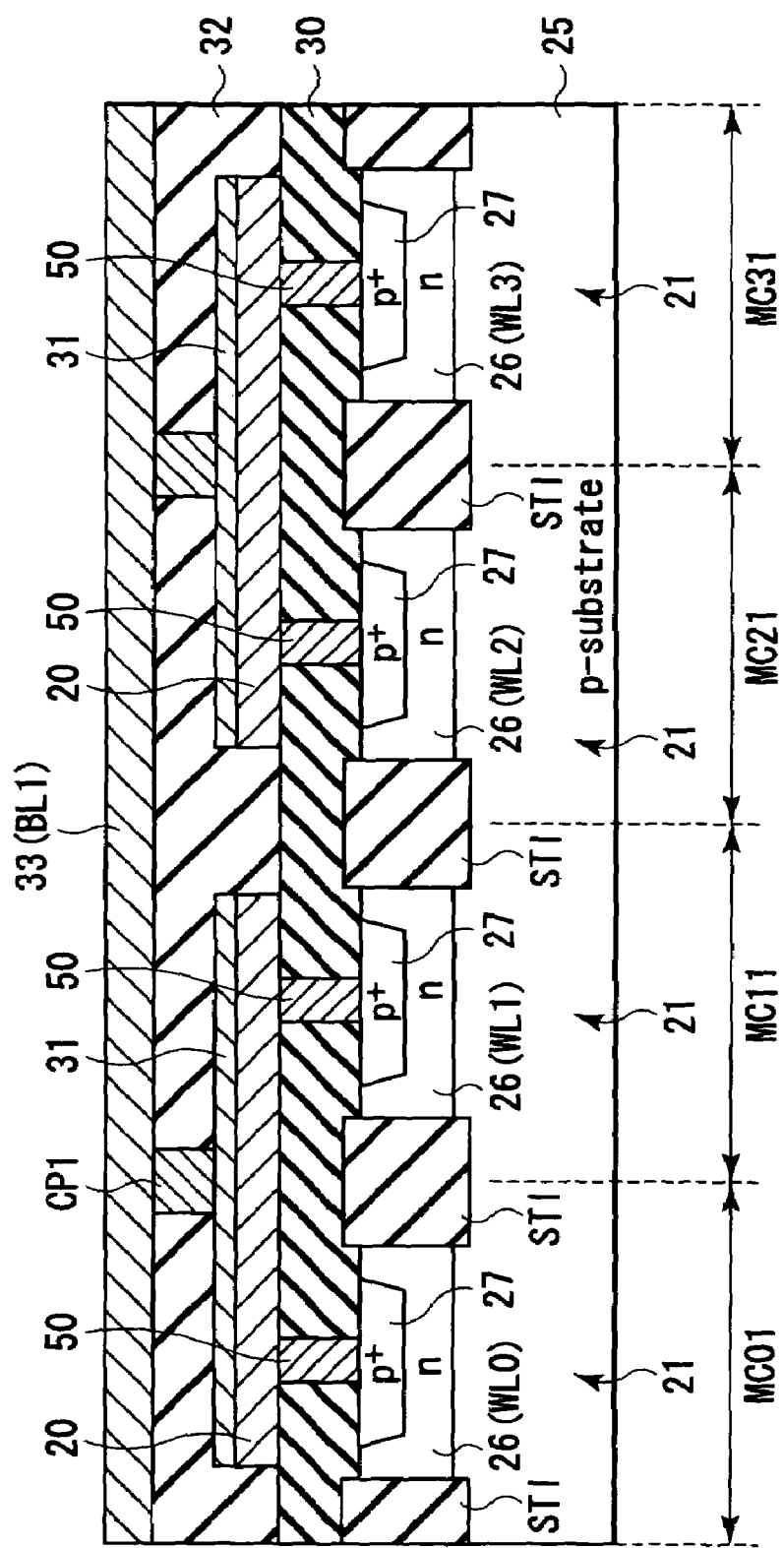
FIG. 21 is a sectional view of the phase-change memory device of the sixth embodiment.

FIG. 21 shows the cross section of the memory cell array of FIG. 20. This cross section corresponds to that taken along line 3—3 of FIG. 2.

As shown in FIG. 21, the column-shaped resistor element 50 is formed on the emitter region 27 of each switching transistor 21. Each phase-change element 20 is formed on an interlayer insulation film 30, and is formed of a material that shows an amorphous-crystalline phase change. Each phase-change element 20 is connected to the resistor elements 50 of two memory cells MC. The two resistor elements 50 connected to one phase-change element 20 contact switching transistors 21 that are connected to different word lines. The other structure of the sixth embodiment is similar to that of the first embodiment.

Figure 22:
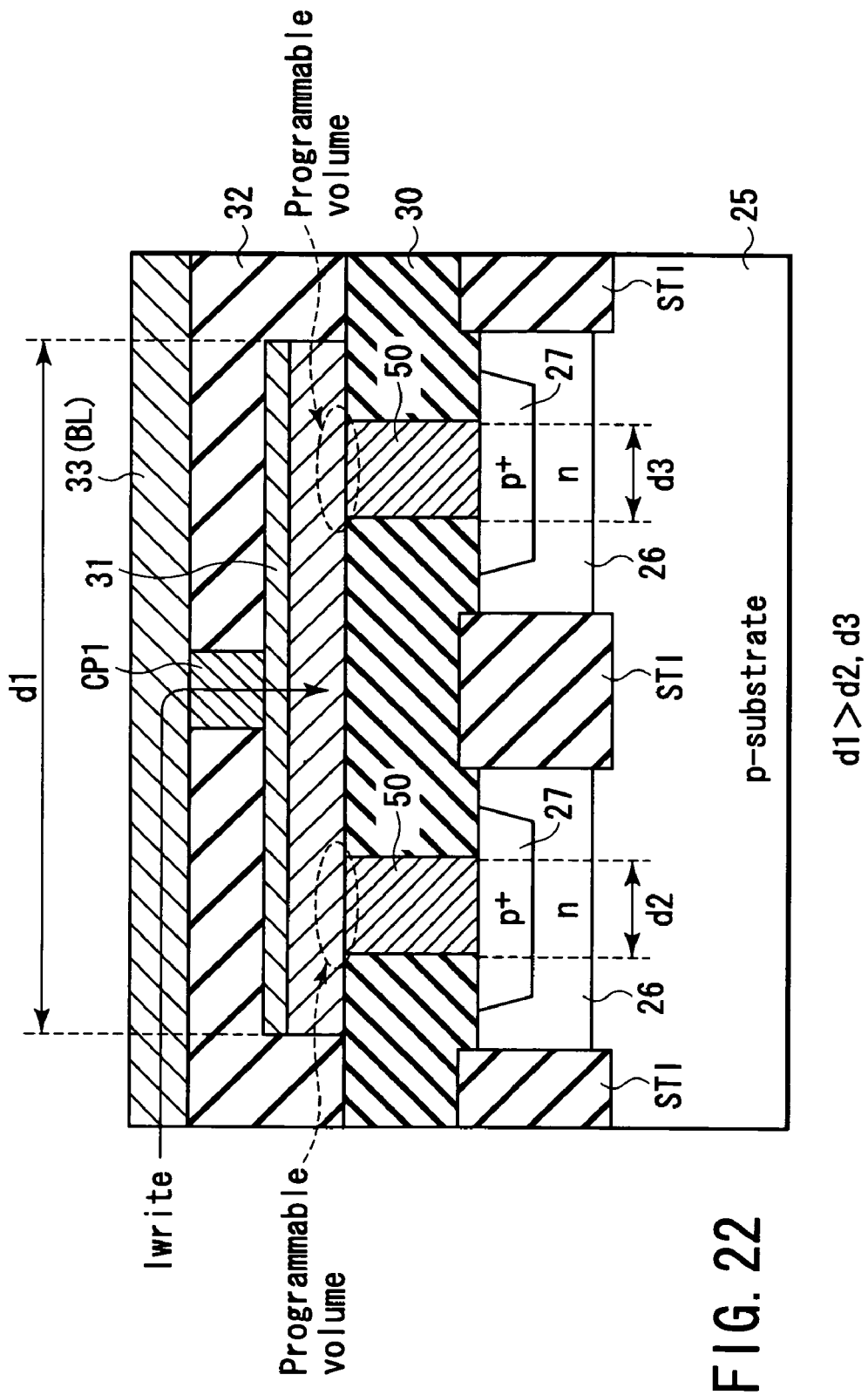
FIG. 22 is an enlarged view illustrating part of the section of FIG. 21.

FIG. 22 is an enlarged view illustrating part of the section of FIG. 21. As seen from FIG. 22, the upper surface of the phase-change element 20 is in contact with the electrode 31. Assume that the contact area is d1, and that the respective contact areas of the resistor elements 50 and phase-change element 20 are d2 and d3. In this case, d1>d2, d3. This means that the resistor element 50 is formed so that its section is smaller than the contact area of the phase-change element 20 and electrode 31.

Accordingly, the contact resistance of the phase-change element 20 and each resistor element 50 is higher than that of the element 20 and electrode 31. In other words, a greater part of the Joule heat obtained when a current is supplied to the phase-change element 20 is generated in the contact regions of the element 20 and resistor elements 50, rather than in the contact region of the element 20 and electrode 31. Therefore, the region in which a change of phase occurs during writing of data, i.e., the programmable volume, is the contact region of the element 20 and each resistor element 50.

The operation of the phase-change memory device of the sixth embodiment is similar to that of the first embodiment, except that the programmable volume is the contact region of the element 20 and each resistor element 50.

The phase-change memory device of the sixth embodiment provides the same advantages 1 and 2 as the first embodiment. Advantage 2 will now be described in detail.

In the structure of the sixth embodiment, the upper surface of the phase-change element 20 contacts the electrode 31, and lower surfaces of the element 20 contact the resistor elements 50. The contact area of the element 20 and each resistor element 50 is smaller than that of the element 20 and electrode 31. Therefore, a greater part of the Joule heat obtained when a voltage pulse is applied to the phase-change element 20 during writing is generated in the contact regions of the element 20 and resistor elements 50. This is because the contact resistance of the phase-change element 20 and each resistor element 50 is higher than that of the element 20 and electrode 31.

Since Joule heat is thus generated in part of the phase-change element 20, the power consumption of the phase-change memory device can be reduced as in the first embodiment.

Figure 23:
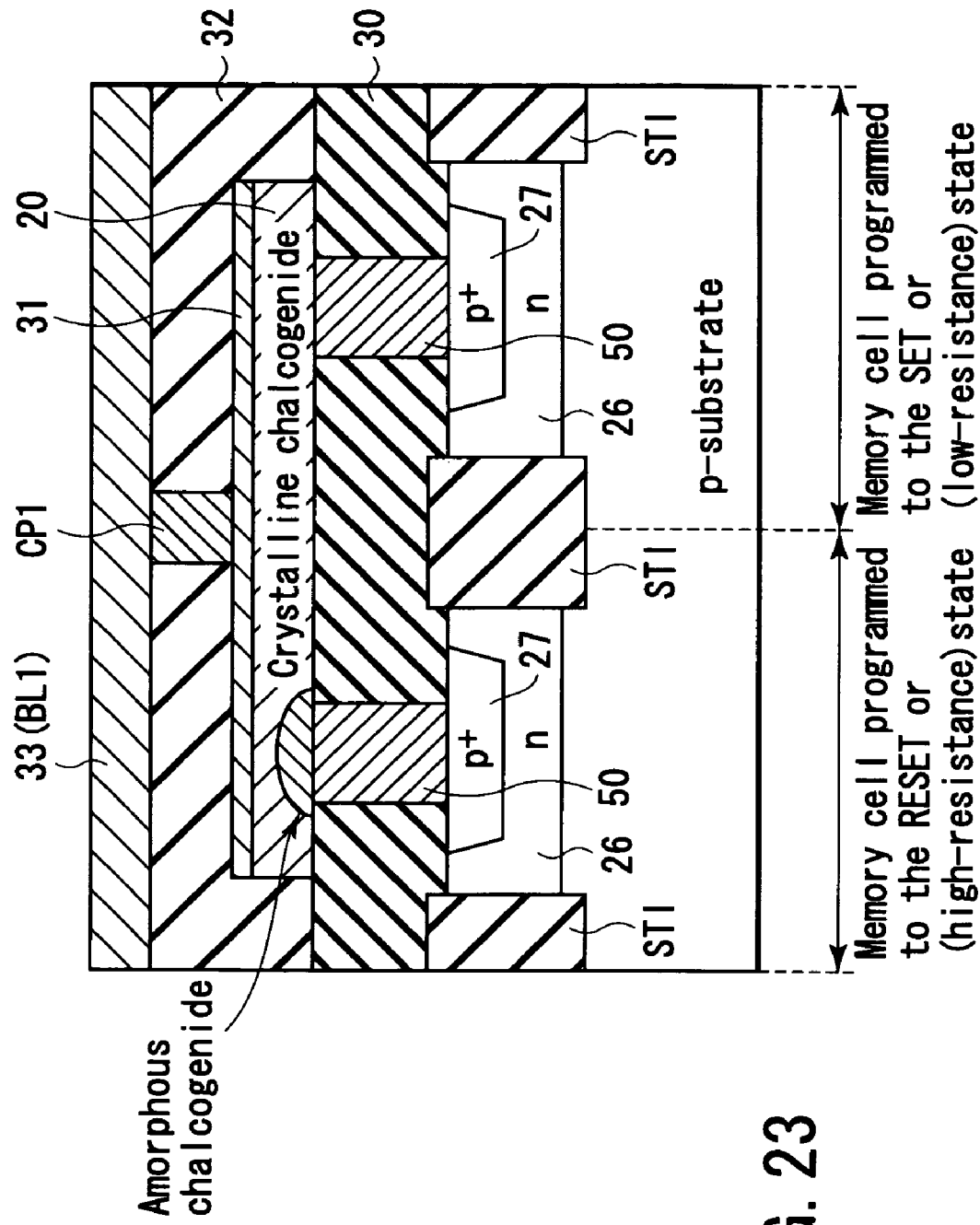
FIG. 23 is another sectional view of the phase-change memory device of the sixth embodiment.

In the phase-change memory device of the sixth embodiment, a single phase-change element 20 is commonly used by two memory cells. However, during writing, a phase change occurs only in the region of the element 20 that contacts each resistor element 50 employed in each memory cell, as shown in FIG. 23. In other words, the regions in which a phase change occurs are separate from each other in units of memory cells. Accordingly, when data is written to one of the two memory cells that commonly use a single phase-change element 20, the other memory cell is not influenced by the one memory cell.

Figures 24, 25:
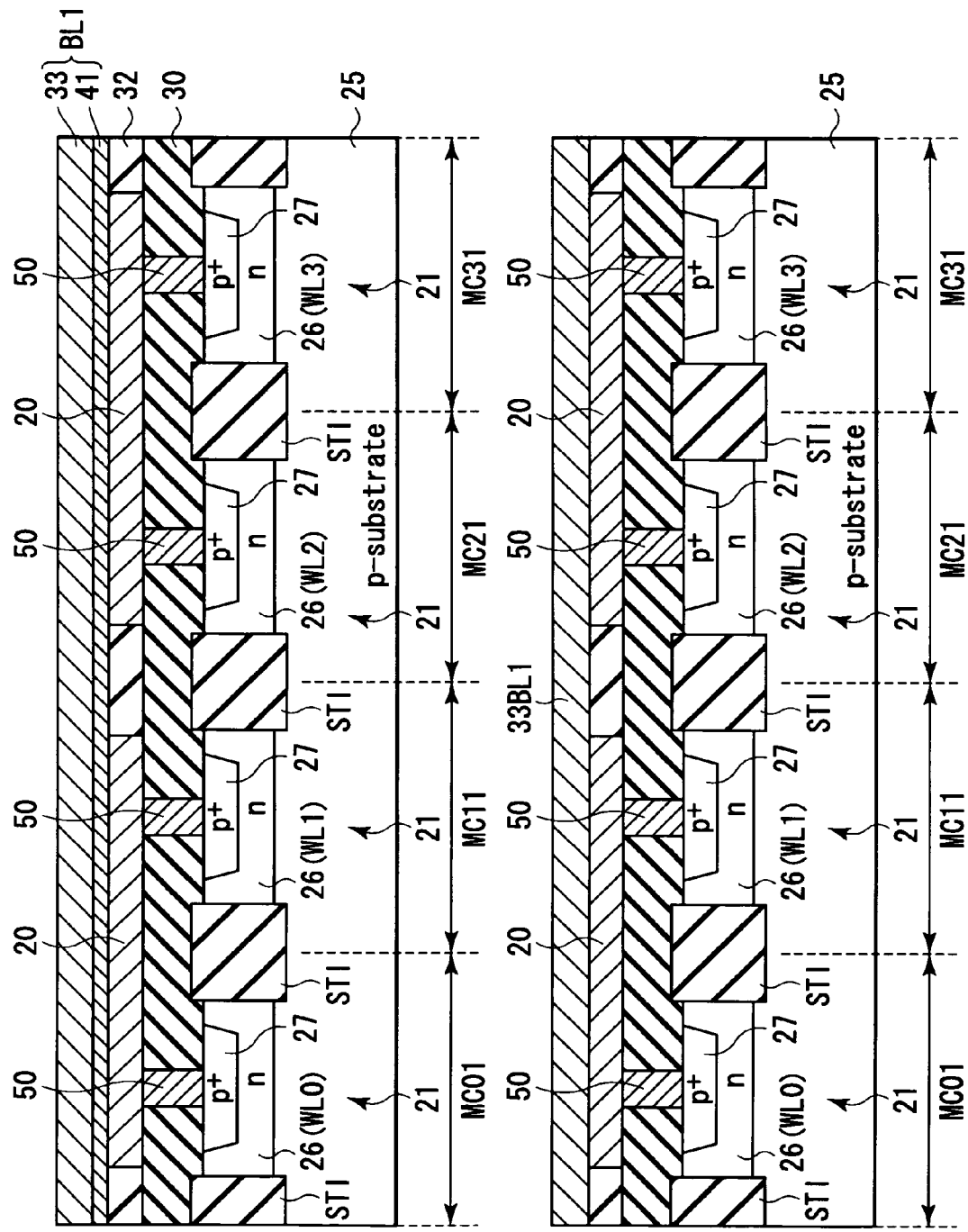
FIGS. 24 to 26 are sectional views of phase-change memory devices according to first to third modifications of the sixth embodiment.

FIG. 24 is a sectional view illustrating a phase-change memory device according to a first modification of the sixth embodiment. This modification is a combination of the third and sixth embodiments. As shown, the first modification differs from the sixth embodiment in that in the former, no contact plugs are employed, and each bit line BL has a multi-layer structure including metal wire layers 41 and 33. The metal wire layer 33 is formed of a low-resistance metal, while the metal wire layer 41 is formed of a material having a high adhesion to a chalcogenide compound.

The first modification of the sixth embodiment provides the same advantage 4 as the third embodiment, in addition to above-described advantages 1 and 2.

FIG. 25 is a sectional view illustrating a phase-change memory device according to a second modification of the sixth embodiment. The second modification is a combination of the fourth and sixth embodiments. As shown, the second modification differs from the sixth embodiment in that in the former, no contact plugs CP1 are employed, and each bit line BL is formed of a low-resistance wire layer 33 having a high adhesion to a chalcogenide compound.

The second modification of the sixth embodiment provides the same advantages 4 and 5 as the third and fourth embodiments, in addition to above-described advantages 1 and 2.

Figure 26:
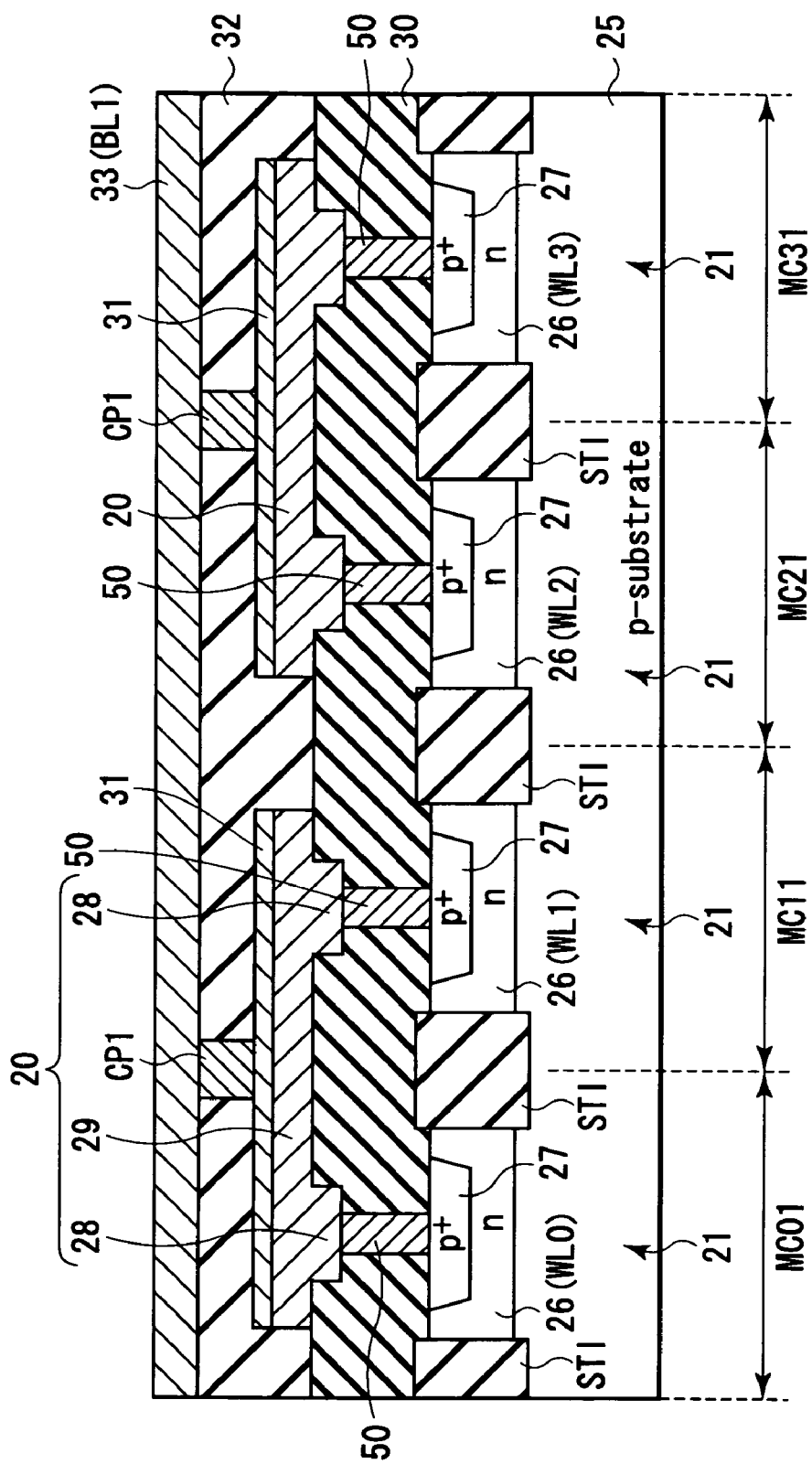

FIG. 26 is a sectional view illustrating a phase-change memory device according to a third modification of the sixth embodiment. The third modification is a combination of the first and sixth embodiments. As shown in FIG. 26, the third modification differs from the first embodiment shown in FIGS. 3 and 4 in that in the former, column-shaped resistor elements 50 are interposed between each phase-change element 20 and the emitter regions 27 of corresponding switching transistors 21. Each resistor element 50 is provided on the corresponding emitter region 27, and has its upper surface kept in contact with the bottom of the corresponding first region 28 of each phase-change element 20.

Figure 27:
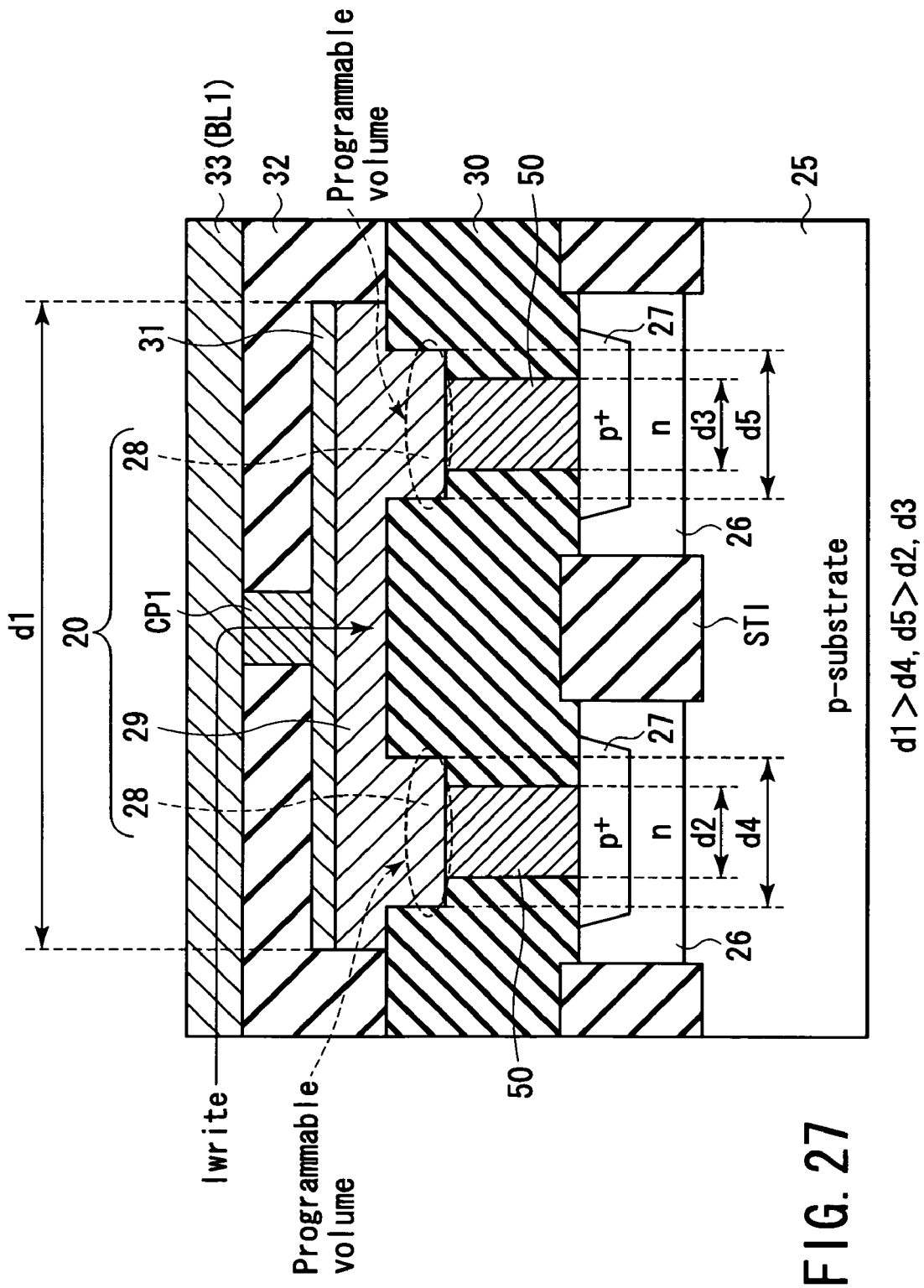
FIG. 27 is an enlarged view illustrating part of the section of FIG. 26.

FIG. 27 is an enlarged view illustrating part of the section of FIG. 26. As shown in FIG. 27, the upper surface of the second region 29 of the phase-change element 20 contacts the electrode 31, the contact area therebetween being d1. The bottoms of the first regions 28 of the phase-change element 20 contact the respective resistor elements 50, the contact areas therebetween being d2 and d3. In this case, d1>d2, d3. This means that the phase-change element 20 is formed so that the contact area of the element 20 and each resistor element 50 is smaller than that of the element 20 and electrode 31 connected to the bit line.

Accordingly, the contact resistance of the phase-change element 20 and each resistor element 50 is higher than that of the element 20 and electrode 31. In other words, a greater part of the Joule heat obtained when a current is supplied to the phase-change element 20 is generated in the contact regions of the element 20 and resistor elements 50, rather than in the contact region of the element 20 and electrode 31. Therefore, the region in which a change of phase occurs during writing of data, i.e., the programmable volume, is the contact region of the element 20 and each resistor element 50.

Accordingly, the third modification of the sixth embodiment provides the same advantages 1 and 2 as the first embodiment.

Figure 28:
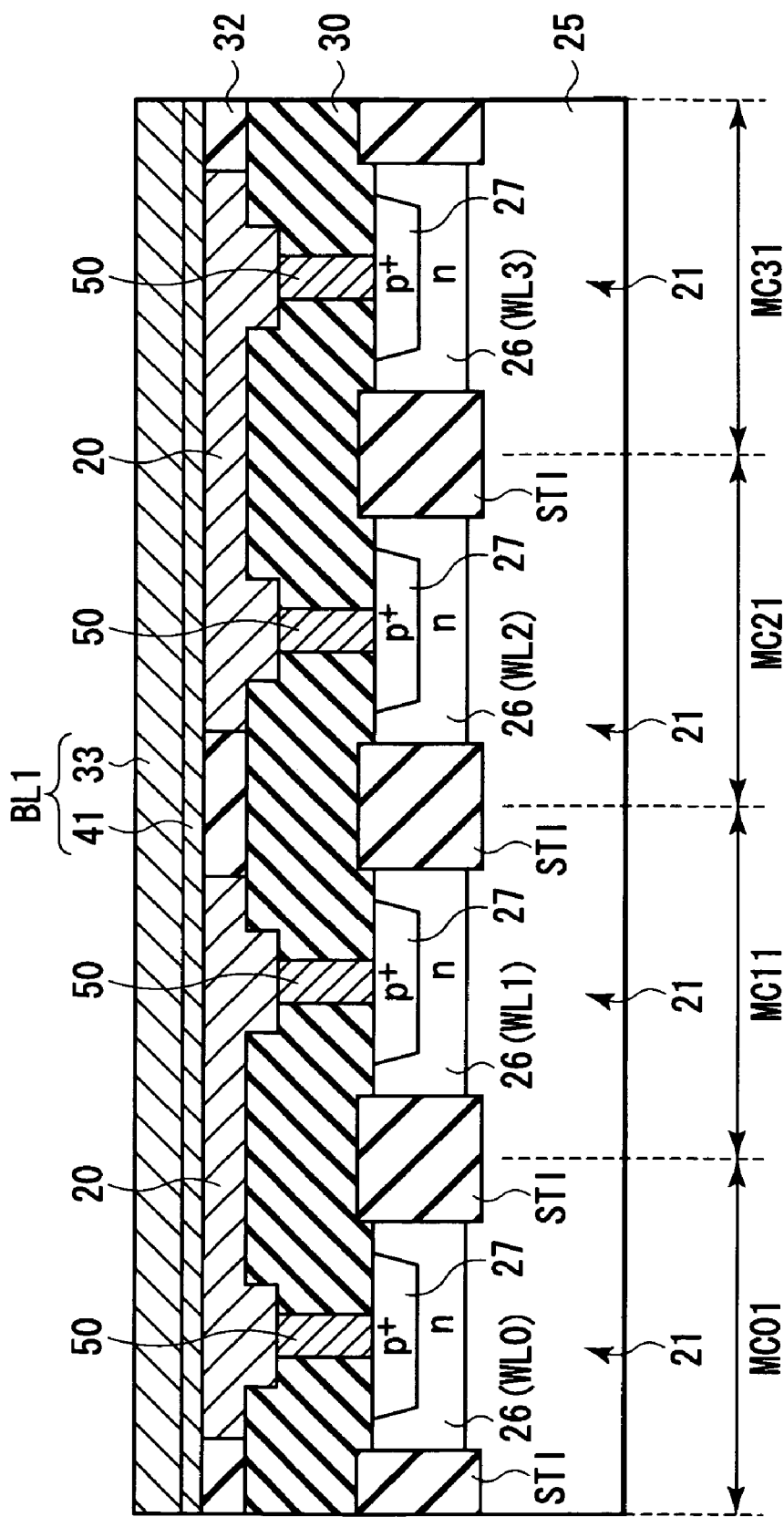
FIGS. 28 and 29 are sectional views of phase-change memory devices according to fourth and fifth modifications of the sixth embodiment.

FIG. 28 is a sectional view illustrating a phase-change memory device according to a fourth modification of the sixth embodiment. The fourth modification is a combination of the third and sixth embodiments. As shown, the fourth modification differs from the third modification shown in FIG. 27 in that in the former, no contact plugs are employed, and each bit line BL has a multi-layer structure including metal wire layers 41 and 33. The metal wire layer 33 is formed of a low-resistance metal, while the metal wire layer 41 is formed of a material having a high adhesion to a chalcogenide compound.

The fourth modification of the sixth embodiment provides the same advantage 4 as the third embodiment, in addition to above-described advantages 1 and 2.

Figure 29:
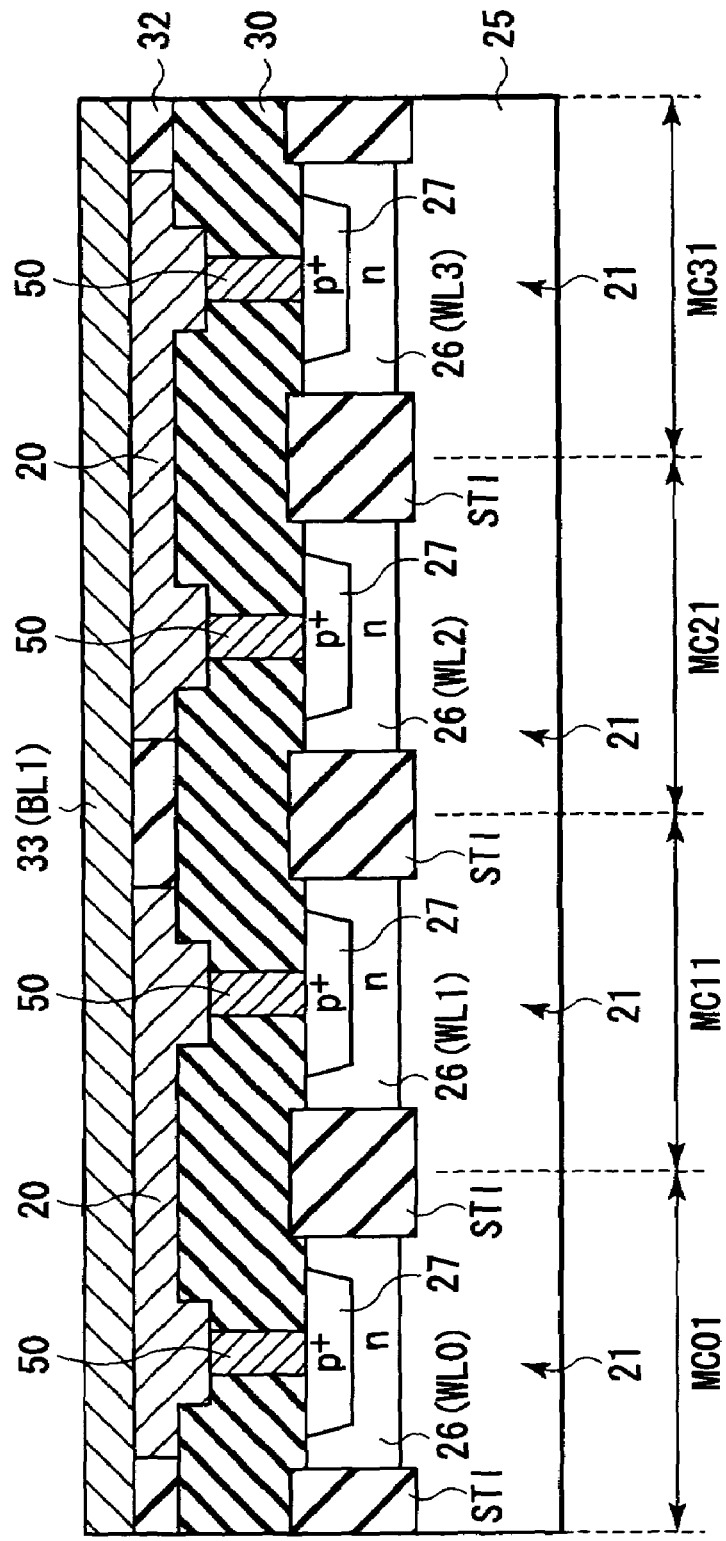

FIG. 29 is a sectional view illustrating a phase-change memory device according to a fifth modification of the sixth embodiment. The fifth modification is a combination of the fourth and sixth embodiments. As shown, the fifth modification differs from the fourth modification shown in FIG. 28 in that in the former, each bit line BL is formed of a low-resistance wire layer 33 having a high adhesion to a chalcogenide compound.

The second modification of the sixth embodiment provides the same advantages 4 and 5 as the third and fourth embodiments, in addition to above-described advantages 1 and 2.

Figure 30:
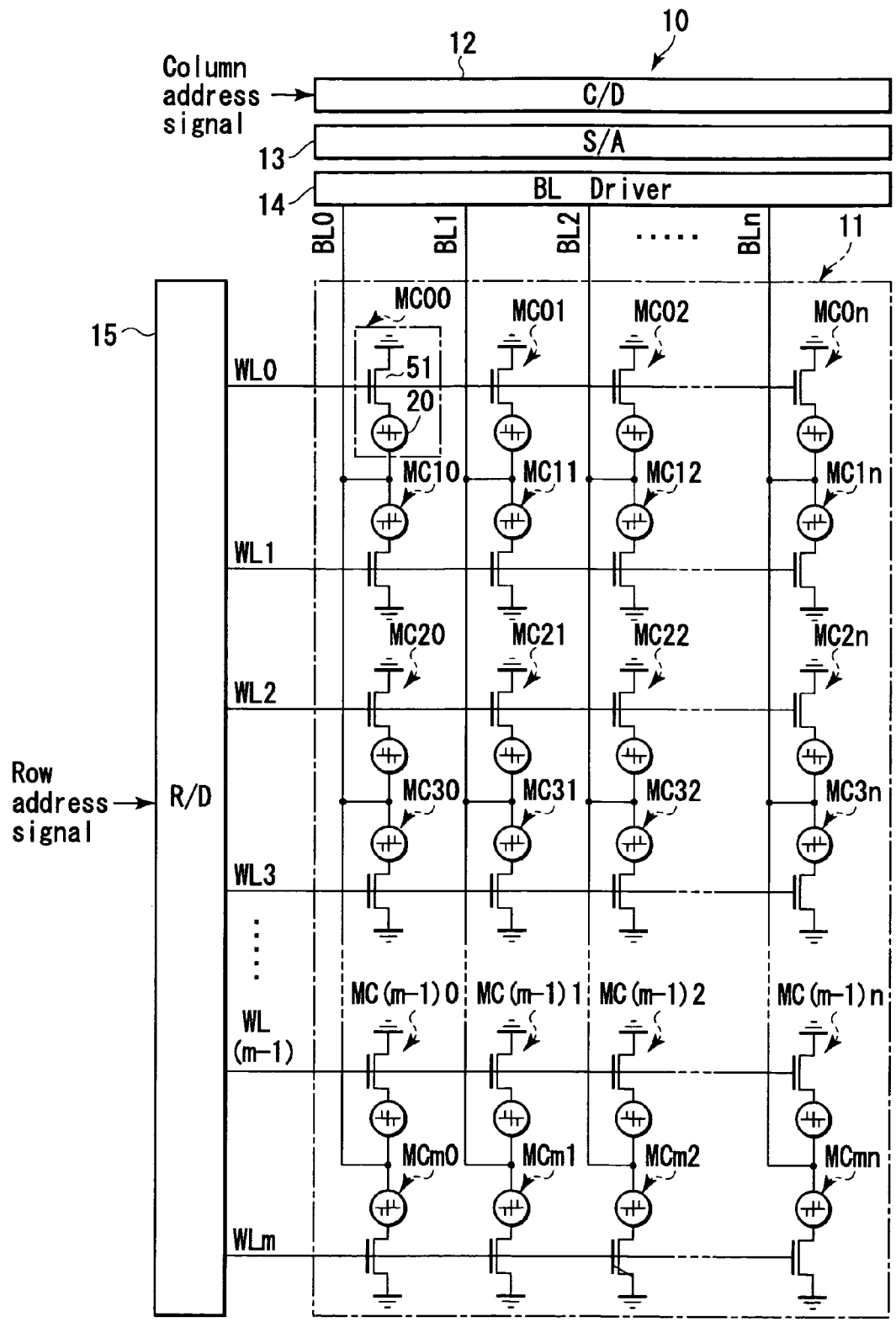
FIG. 30 is a block diagram of a phase-change memory device according to a seventh embodiment.

A phase-change memory device according to a seventh embodiment will now be described. The seventh embodiment differs from the first to sixth embodiments in that in the former, MOS transistors are used as switching transistors, instead of the bipolar transistors. FIG. 30 is a block diagram illustrating the phase-change memory device of the seventh embodiment.

As seen from FIG. 30, each memory cell MC includes a phase-change element 20 and MOS transistor 51. The source of the transistor 51 is connected to ground, and the drain of the transistor is connected to one end of each phase-change element 20. Further, the gates of the transistors 51 arranged in the same row are connected to one of the word lines WL0 to WLm. The other end of each of the phase-change elements 20 arranged in the same column is connected to one of the bit lines BL0 to BLn.

Figure 31:
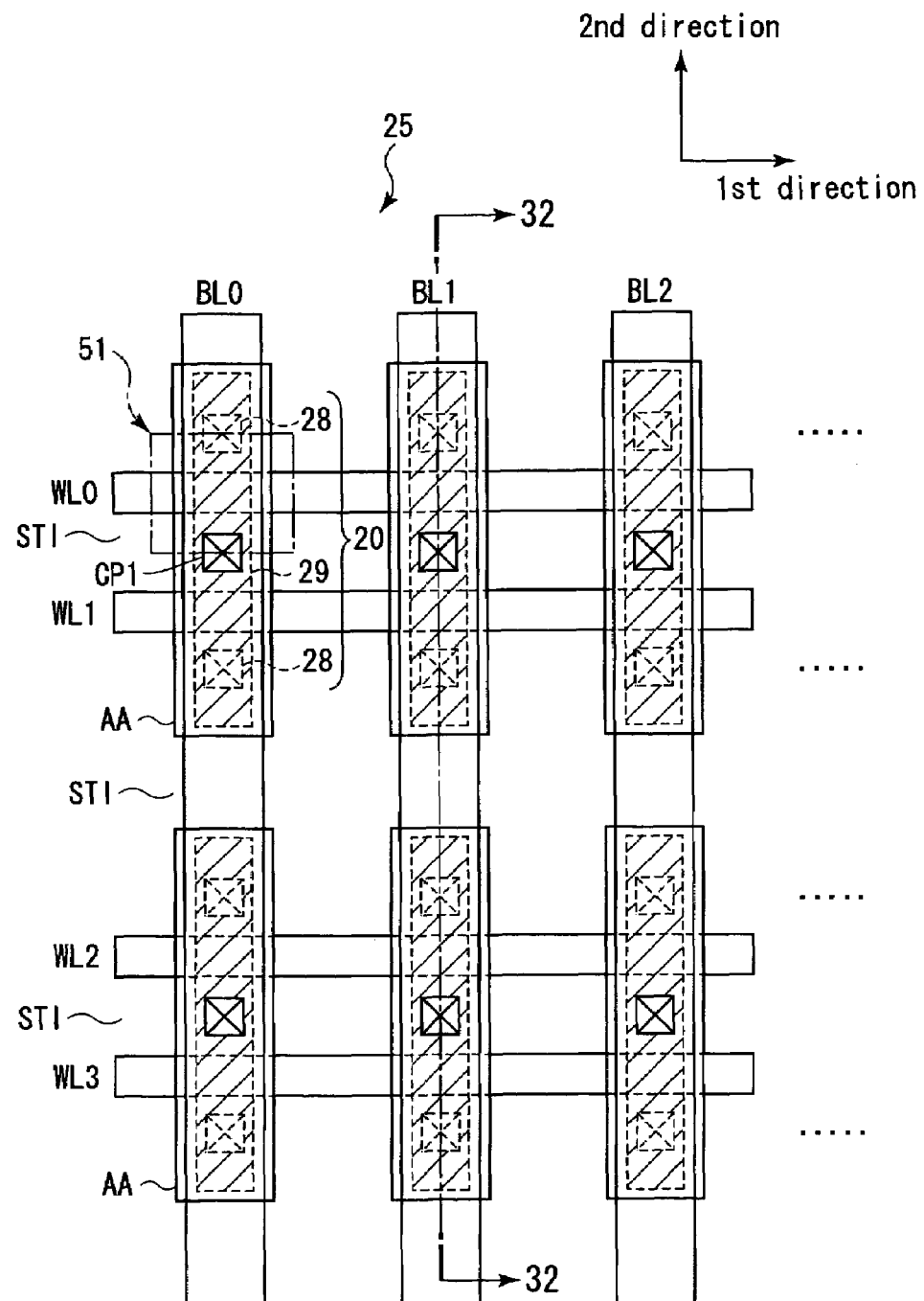
FIG. 31 is a plan view of the phase-change memory device of the seventh embodiment.

Referring to FIG. 31, the plane pattern of the memory cell array 11 will be described. FIG. 31 is a plan view of the array 11.

As shown, a p-type semiconductor substrate 25 has element regions AA extending in a second direction and arranged in a stripe pattern, and word lines WL0 to WLm extending in the first direction and arranged in a stripe pattern. Two word lines passes through a single element region AA. An impurity diffusion region (not shown) is formed in each element region AA. Each MOS transistor 51 includes a corresponding word line and impurity diffusion region. A phase-change element 20 is provided on each element region AA. The phase-change element 20 has first and second regions 28 and 29. The first region 28 is provided on the source of each MOS transistor 51 and is column-shaped. The second region 29 is in the shape of a stripe extending in a second direction, and bridges a pair of MOS transistors 51 arranged in the same element region AA. The second region 29 is connected to the first regions 28 that are connected to the pair of MOS transistors 51 in the same element region AA.

The bit lines BL0 to BLn extending in the second direction and arranged in a stripe pattern are provided on the phase-change elements 20. Each bit line BL0 to BLn is connected by contact plugs CP1 to the second regions 29 of the phase-change elements 20 arranged in the corresponding column.

Figure 32:
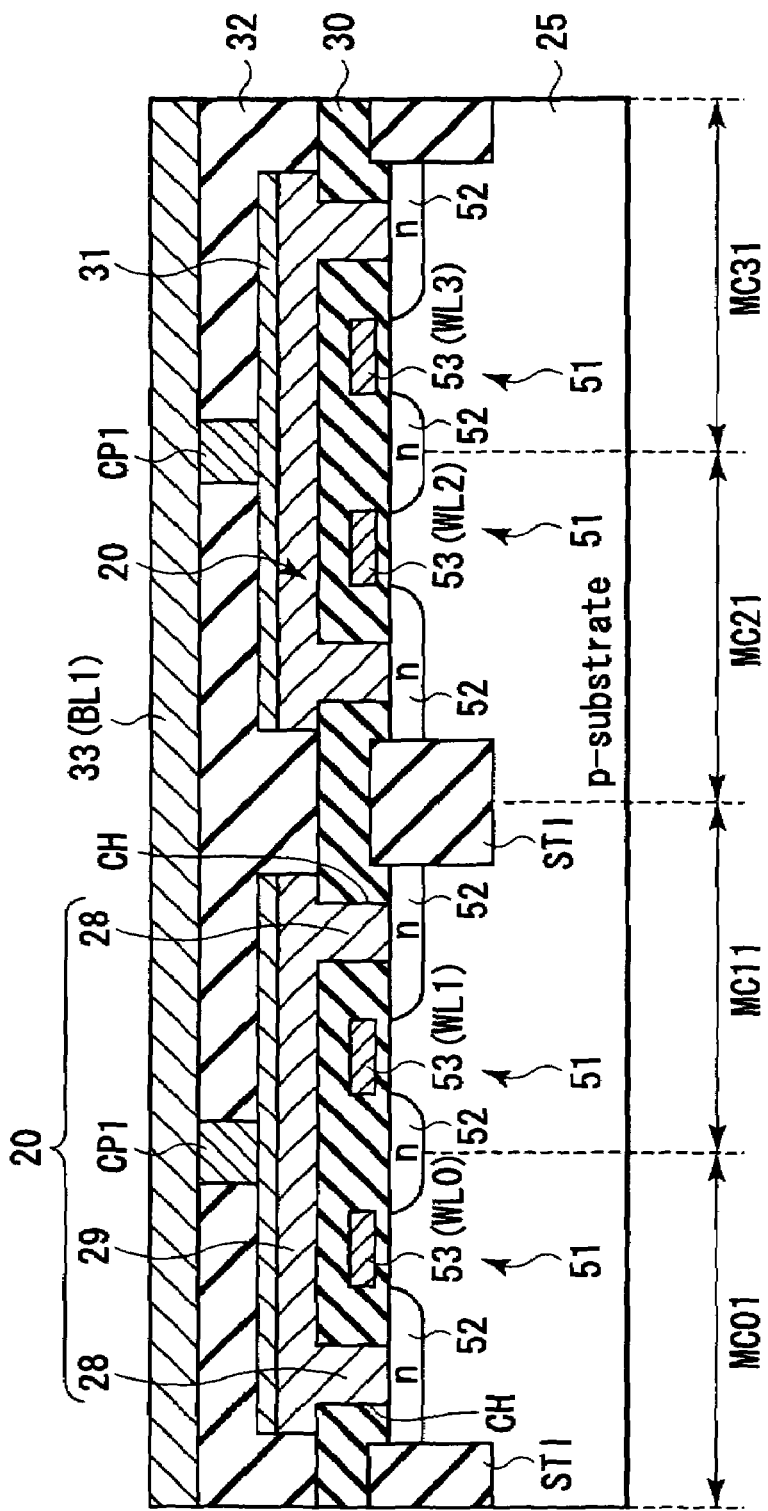
FIG. 32 is a sectional view taken along line 32—32 of FIG. 31.

Referring to FIG. 32, the sectional structure of the memory cell array 11 will be described. FIG. 32 is a view taken along line 32—32 in FIG. 31.

As shown in FIG. 32, an element isolation region STI is formed in the p-type semiconductor substrate 25. MOS transistors 51 are formed on each element region AA defined by the element isolation region STI. In other words, n-type impurity diffusion layers 52 isolated from each other are formed in the surface of each element region AA. Each n-type impurity diffusion layer 52 functions as the source/drain regions of each MOS transistor 51. Further, the gate electrodes 53 of MOS transistors 51 are provided on the semiconductor substrate 25 between the source/drain regions. The gate electrode 53 functions as one of the word lines WL0 to WLm.

An interlayer insulation film 30 is formed on the semiconductor substrate 25, covering the MOS transistors 51. Contact holes CH are made in the interlayer insulation film 30 so that they extend from the surface of the film 30 to the respective drain regions 52. The phase-change elements 20 are formed on the interlayer insulation film 30, filling the contact holes CH. As described above, each phase-change element 20 includes the first and second regions 28 and 29. The first region 28 is in the shape of a column to be filled in each contact hole CH, and the bottom of the column reaches the drain region 52 of the corresponding MOS transistor 51. Further, the second region 29 is provided on the interlayer insulation film 30 and connected to the first regions 28 of two memory cells MC. The two first regions 28 commonly connected to the second region 29 contact MOS transistors 51 that are connected to different word lines. The other structure is similar to that of FIG. 3 employed in the first embodiment. The source region of each MOS transistor 51 is connected to, for example, ground. The source regions of the MOS transistors may be connected to ground via respective n-type impurity diffusion layers 52 or via a single dedicated metal wire layer.

The upper surface of the second region 29 of each phase-change element 20 contacts the electrode 31. Further, the bottom of the second region 29 of each phase-change element 20 reaches the drain regions of the corresponding MOS transistors 51. The contact area of the bottom of the second region 29 and each drain region 52 is smaller than that of the second region 29 and electrode 31.

Accordingly, the contact resistance of the phase-change element 20 and each drain region 52 is higher than that of the element 20 and electrode 31. That is, a greater part of the Joule heat obtained when a current is supplied to the phase-change element 20 is generated in the contact regions of the element 20 and drain regions 52, rather than in the contact region of the element 20 and electrode 31. Therefore, the region in which a change of phase occurs during writing of data, i.e., the programmable volume, is the contact region of the element 20 and each drain region 52.

The phase-change memory device of the seventh embodiment operates in the same manner as that of the first embodiment.

As described above, even the phase-change memory device of the seventh embodiment, in which MOS transistors are used as switching transistors, provides the same advantages 1 and 2 as the first embodiment. As a matter of course, MOS transistors may be also used as the switching transistors in the second to fifth embodiments. In this case, the second to fifth embodiments provide advantages 3 to 6, respectively, in addition to advantages 1 and 2.

Figure 33:
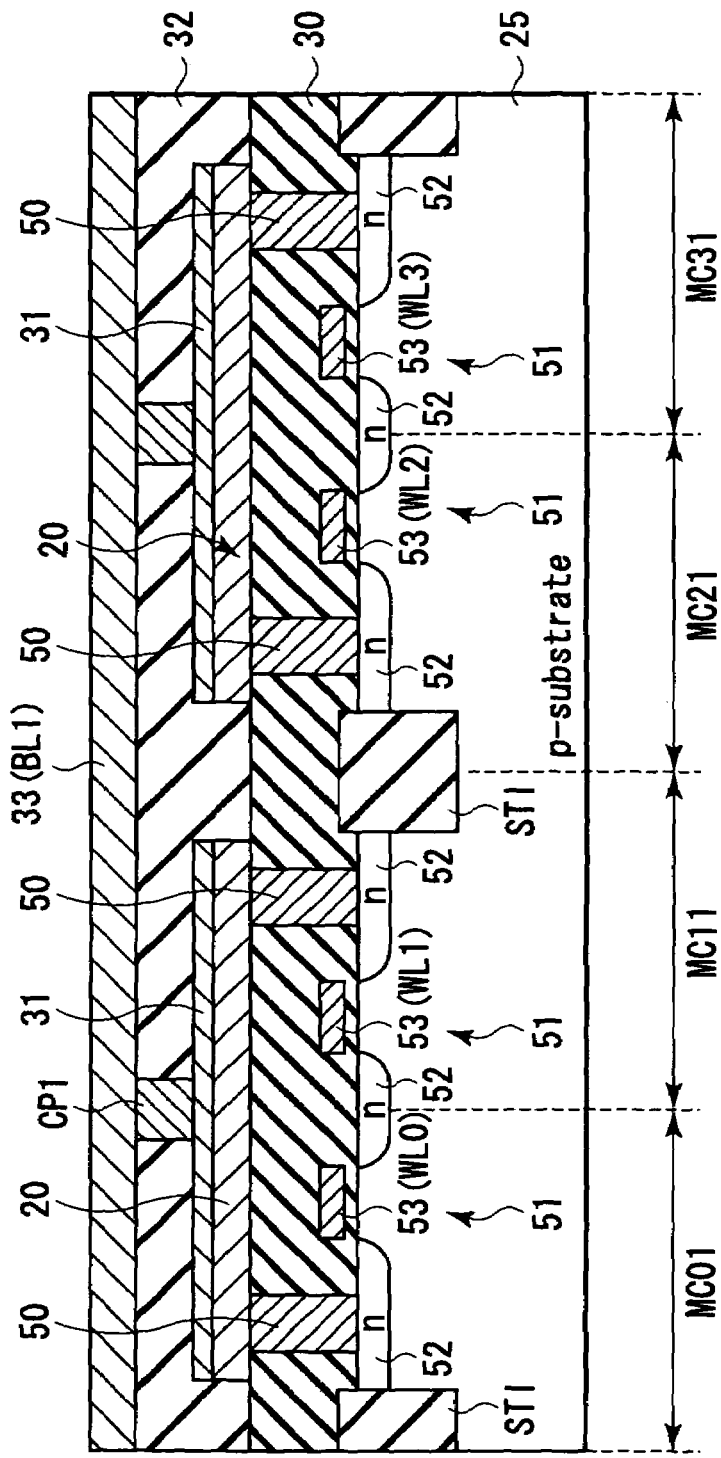
FIG. 33 is a sectional view illustrating a modification of the seventh embodiment.

FIG. 33 is a sectional view illustrating a modification of the seventh embodiment. As shown, a resistor element 50 is provided on the drain region 52 of each MOS transistor 51. Thus, even where each memory cell MC includes a phase-change element, resistor element and switching transistor, the switching transistor may be formed of a MOS transistor.

Figure 34:
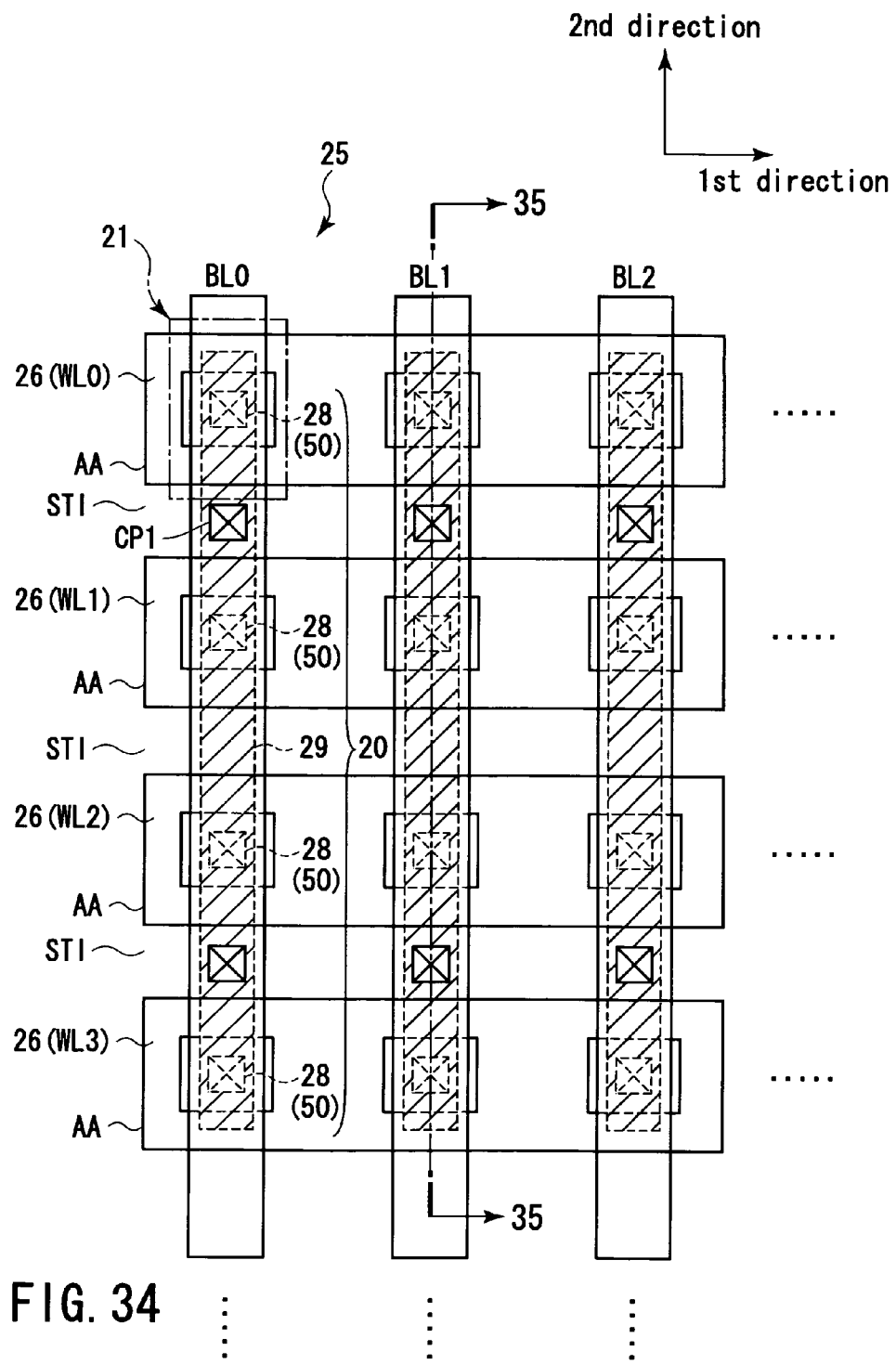
FIG. 34 is a plan view of the phase-change memory device of the eighth embodiment.

A phase-change memory device according to an eighth embodiment will be described. The eighth embodiment differs from the first to seventh embodiments in that in the former, each phase-change element 20 is commonly used by four memory cells MC. FIG. 34 is a plan view of the phase-change memory device of the eighth embodiment.

As seen from FIG. 34, in the phase-change memory device of the eighth embodiment, the respective four first regions 28 of each phase-change element 20 are provided on four switching transistors 21. Further, the second region 29 of each element 20 is connected to the four first regions 28 connected to the respective four switching transistors 21.

Figure 35:
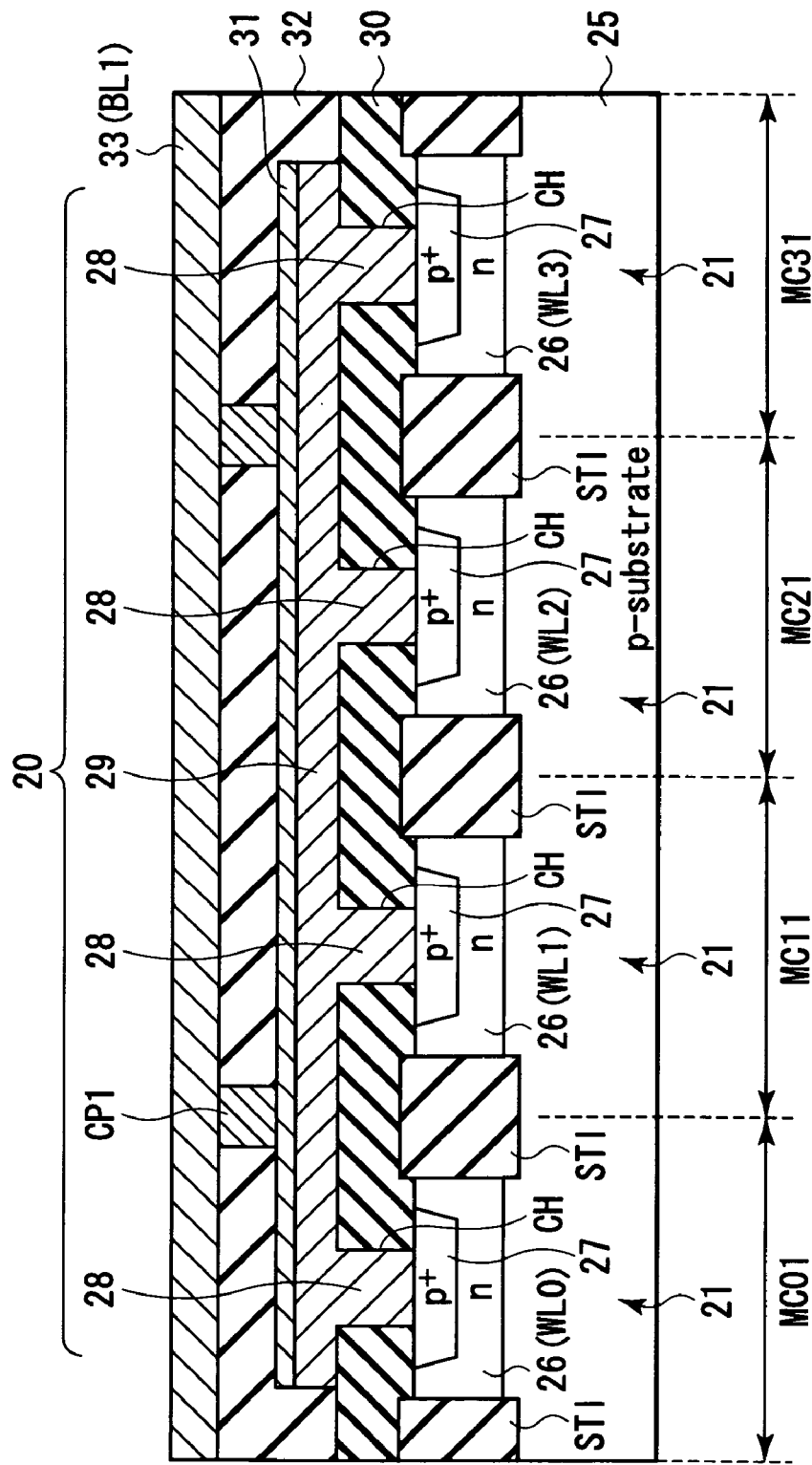
FIG. 35 is a sectional view taken along line 35—35 of FIG. 34.

FIG. 35 is a sectional view taken along line 35—35 of FIG. 34.

As shown, the second region 29 is commonly connected to the four first regions 28 that are connected to respective four memory cells MC. Of course, the contact area of each first region 28 and corresponding emitter region 27 is smaller than that of the second region 29 and electrode 31. As described above, the four first regions 28 connected to the same second region 29 are connected to respective switching transistors 21 that are connected to different word lines.

In the above structure, a phase change occurs in the region of the phase-change element 20 that contacts each emitter region 27.

Although the structure shown in FIG. 35 is similar to that of the first embodiment, it may be similar to those of the second to seventh embodiments.

Figure 36:
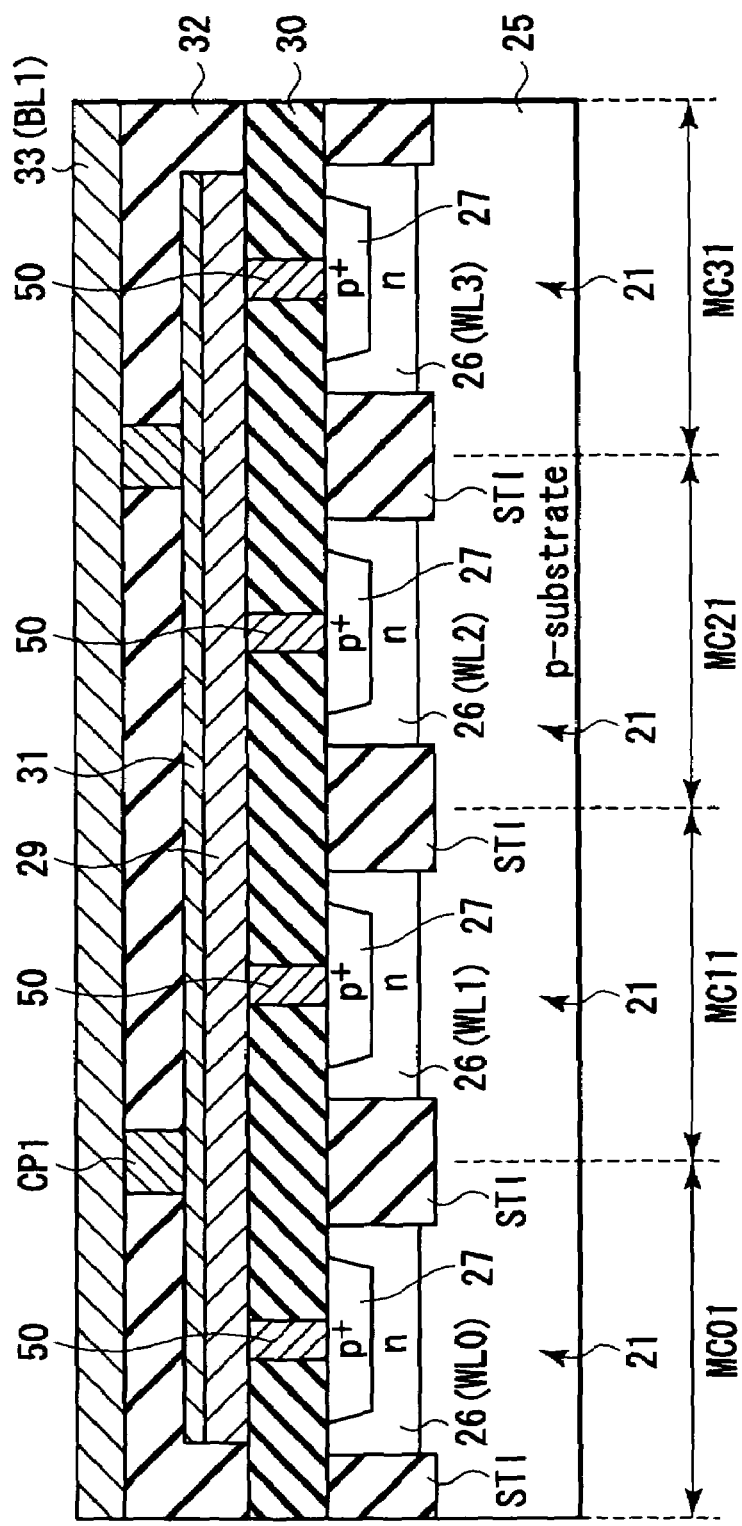
FIG. 36 is a sectional view of a modification of the eighth embodiment, taken along line 35—35 of FIG. 34.

FIG. 36 shows a case where each memory cell has a phase-change element, switching transistor 21 and resistor element 50. In this case, however, the four resistor elements 50 connected to each phase-change element 20 are connected to respective switching transistors 21 that are connected to different word lines. In this structure, a phase change occurs in the region of the phase-change element 20 that contacts each resistor element 50.

As described above, one phase-change element 20 may be commonly used by four memory cells MC. Further, one phase-change element 20 may be commonly used by three memory cells MC or five or more memory cells MC. However, it is necessary to connect, to different word lines, the memory cells that commonly use one phase-change element 20.

Figure 37:
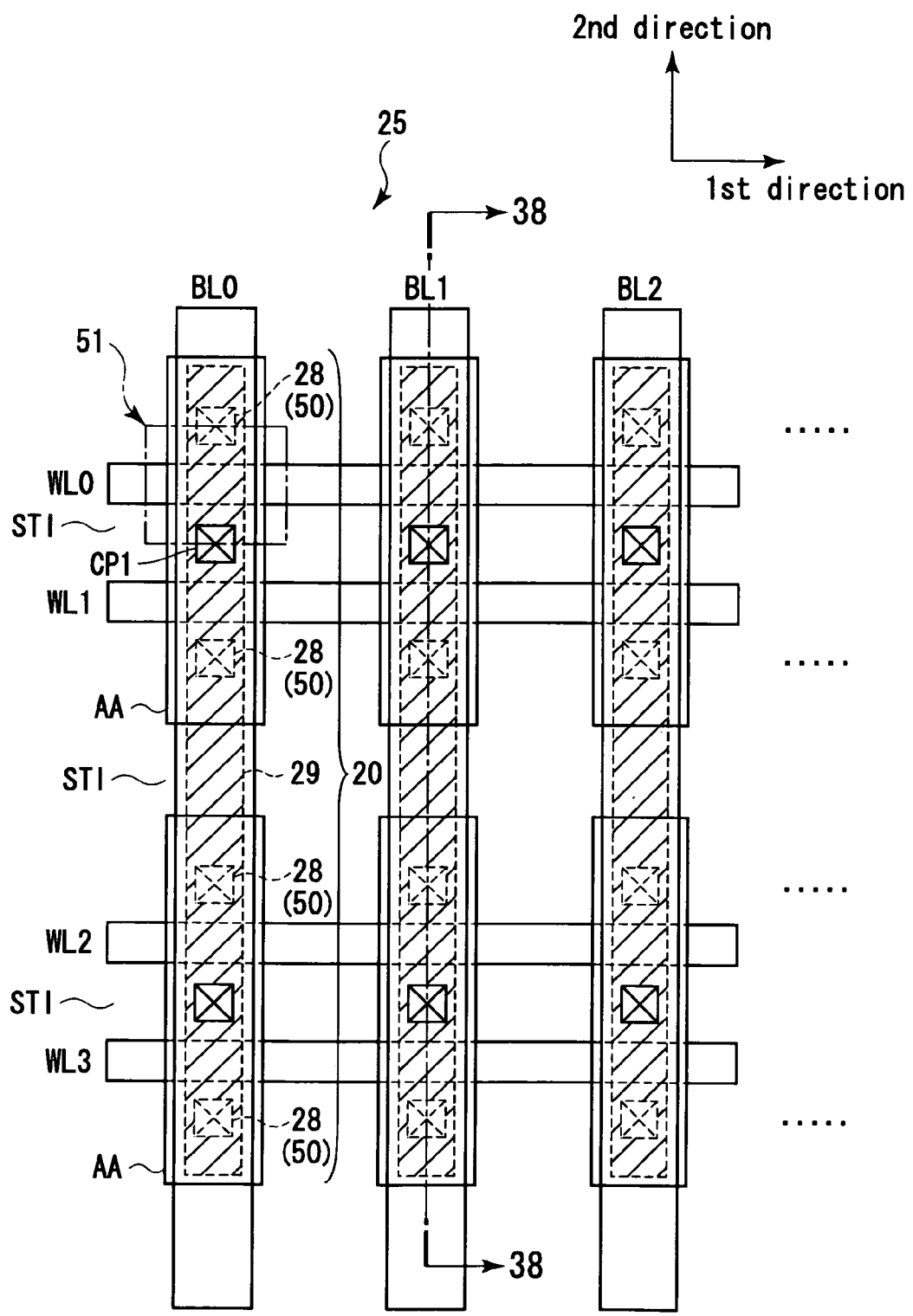
FIG. 37 is a plan view of a phase-change memory device according to a modification of the eighth embodiment.
Figure 38:
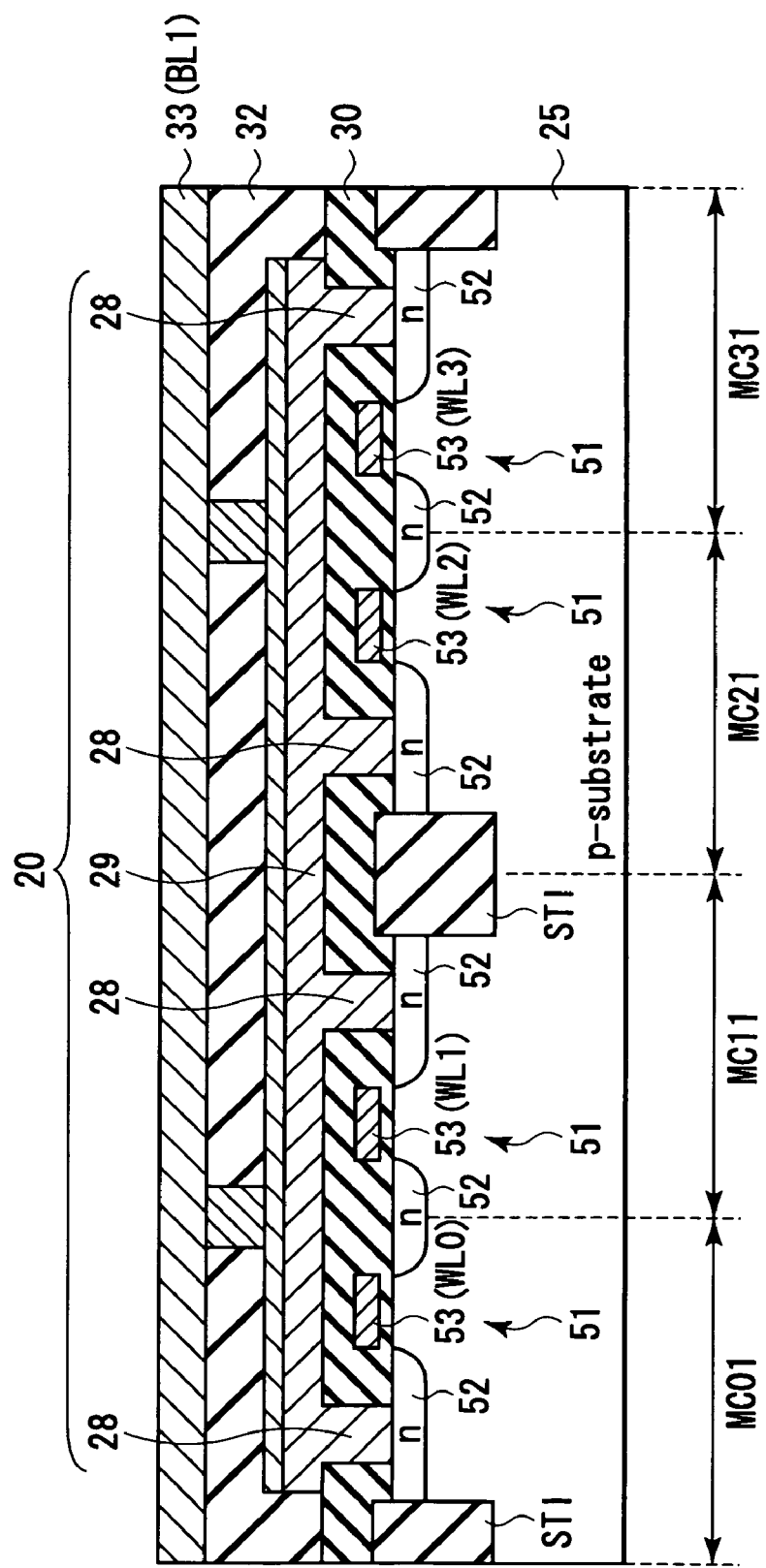
FIG. 38 is a sectional view taken along line 38—38 of FIG. 37.
Figure 39:
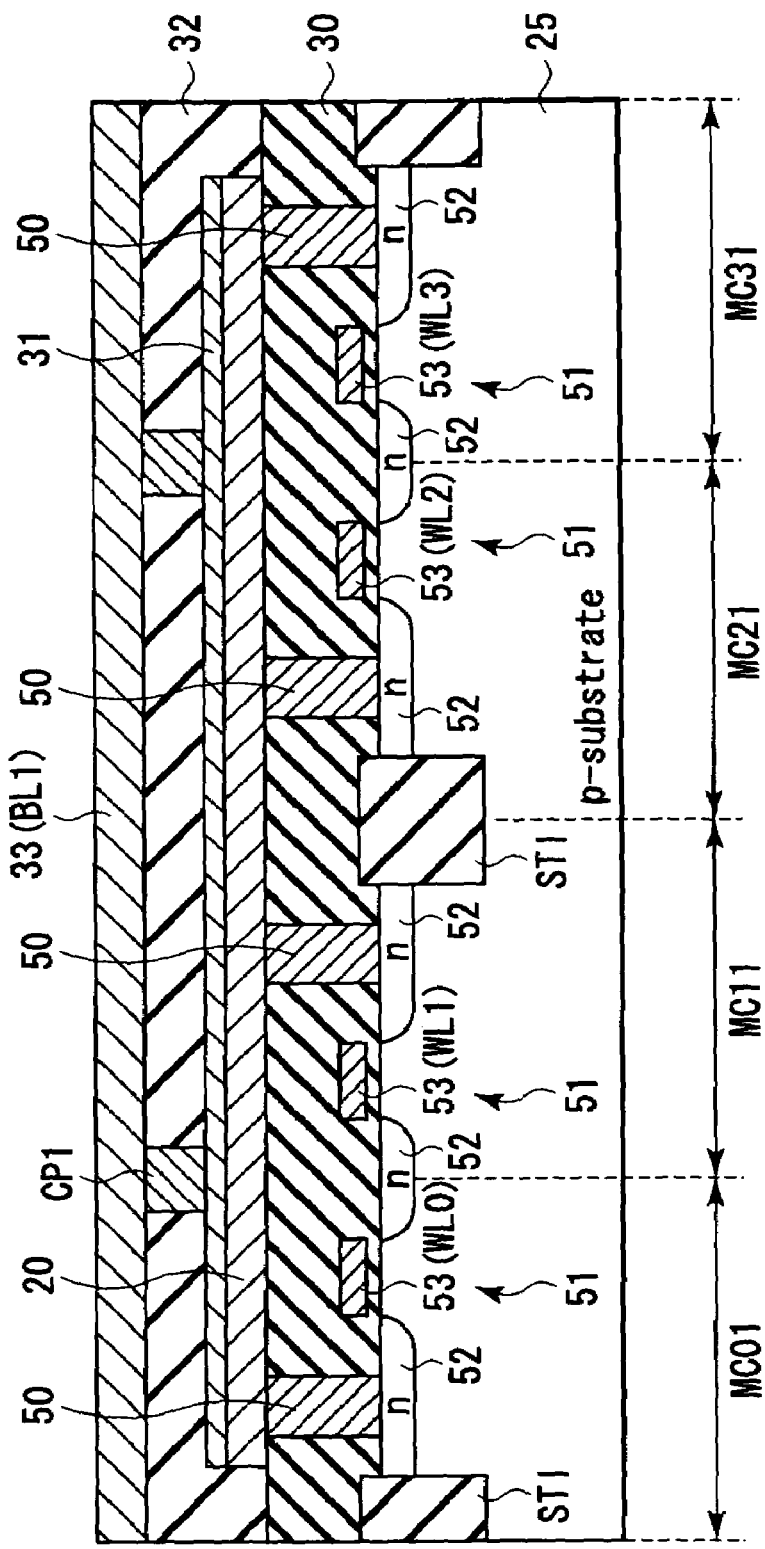
FIG. 39 is a sectional view of a modification of the eighth embodiment, taken along line 38—38 of FIG. 37.

FIG. 37 is a plan view illustrating the memory cell array obtained by combining the eighth and seventh embodiments. FIGS. 38 and 39 are sectional views taken along line 38—38 of FIG. 37. Specifically, FIG. 38 shows a case where each memory cell MC has a phase-change element 20 and MOS transistor 51, while FIG. 39 shows a case where each memory cell MC has a phase-change element 20, MOS transistor 51 and resistor element 50. Thus, the eighth embodiment is also applicable to the case where the switching transistors are formed of MOS transistors.

The eighth embodiment can further reduce the number of patterning steps, thereby simplifying the manufacturing process. Although in the cases of FIGS. 36, 38 and 39, two contact plugs CP1 are connected to each phase-change element 20, one contact plug or three or more contact plugs may be connected to each element 20.

As described above, in the first to eighth embodiments, a single phase-change element is commonly used by a plurality of memory cells connected to the same bit line. Further, the contact area of the phase-change element and the switching transistor of each memory cell is smaller than that of the element and the electrode on the bit line side. Accordingly, the required area of the memory cell array can be reduced, and the power consumption of the phase-change memory device can be reduced.

In the above-described embodiments, GeTeSb is used as the material of the phase-change element. However, it is sufficient if the material that shows a phase change between the amorphous phase and crystalline phase is used as the material of the phase-change element. For example, binary compounds, such as GaSb, InSb, InSe, $Sb_2Te_3$, GeTe, etc., ternary compounds, such as $Ge_2Sb_2Te_5$, InSbTe, GaSeTe, $SnSb_2Te_4$, InSbGe, etc. and quaternary compounds, such as AgInSbTe, (GeSn)SbTe, GeSb(SeTe), $Te_{81}Ge_{15}Sb_2S_2$, etc. may be used.

Furthermore, in the above embodiments, pnp bipolar transistors having their collectors grounded, and n-channel MOS transistors having their sources grounded are used as the switching transistors. However, npn bipolar transistors having their collectors connected to the power supply potential, and p-channel MOS transistors having their sources connected to the power supply potential may be used as the switching transistors.

In addition, in the above embodiments, the memory cells have phase-change elements connected to the bit lines. However, the connection relationship of each phase-change element and corresponding switching transistors may be opposite to that employed in the embodiments. Specifically, each phase-change element may have one end grounded or connected to the power supply potential, and the other end connected to one end of the current path of each of the corresponding switching transistors, while the other end of each switching transistor may be connected to a bit line. In this case, it is sufficient if the other end of each phase-change element of memory cells is connected to the other end of any other phase-change element of the memory cells, and the contact area of the other end of each phase-change element and one end of the current path of a corresponding transistor is smaller than the contact area of one end of each phase-change element and the corresponding electrode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A phase-change memory device comprising: memory cells including phase-change layers formed on a semiconductor substrate, the phase-change layer showing an amorphous-crystalline phase change;
a memory cell array which has the memory cells arranged in a matrix, the phase change layer including first regions which contact the semiconductor substrate in units of memory cells and a second region which connects the first regions arranged in a same column;
a first electrode layer formed on the second region of each phase-change layer, a contact area of each first region and the semiconductor substrate being smaller than a contact area of the second region and the first electrode layer, the first regions and the second region being formed of a material which shows a phase change between an amorphous phase and a crystalline phase;
a word line which connects the memory cells arranged in a same row; and
a bit line electrically connected to the first electrode layer, the bit line connecting in common the phase-change layers of the memory cells arranged in the same column.

2. The device according to claim 1, further comprising a contact plug which connects the first electrode layer and the bit line.

3. The device according to claim 1, wherein each phase-change layer further includes a third region interposed between the second region and each first region, the third region having a width greater than the contact area of each first region and the semiconductor substrate, and less than the contact area of the second region and the first electrode layer.

4. The device according to claim 1, further comprising a resistor element formed on the semiconductor substrate with respect to each memory cell and provided for each memory cell between the semiconductor substrate and the first region of each phase-change layer, a contact area of the resistor element and each first region being smaller than the contact area of the second region and the first electrode layer.

5. The device according to claim 1, further comprising a second electrode layer interposed between each first region and the semiconductor substrate.

6. The device according to claim 5, wherein an upper surface of the second electrode layer opposing each first region is larger than a surface of each first region opposing the second electrode layer.

7. The device according to claim 1, wherein each memory cell further includes a bipolar transistor formed in the semiconductor substrate, a collector or an emitter of the bipolar transistor being connected to a corresponding one of the first regions, a base of the bipolar transistor being connected to the word line.

8. The device according to claim 1, wherein each memory cell further includes a MOS transistor formed on the semiconductor substrate, a source or a drain of the MOS transistor being connected to a corresponding one of the first regions, a gate of the MOS transistor being connected to the word line.

9. The device according to claim 1, wherein the second region of each phase-change layer is in a crystalline state, and at least part of each first region of each phase-change layer assumes one of the crystalline state and an amorphous state in accordance with write data.

* * * * *